United States Patent
Yao

(10) Patent No.: US 12,106,714 B2
(45) Date of Patent: Oct. 1, 2024

(54) PIXEL DRIVING CIRCUIT, DISPLAY PANEL AND DRIVING METHOD THEREFOR, AND DISPLAY DEVICE

(71) Applicant: Hubei Yangtze Industrial Innovation Center Of Advanced Display Co., Ltd., Wuhan (CN)

(72) Inventor: Qijun Yao, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 0 days.

(21) Appl. No.: 18/174,108

(22) Filed: Feb. 24, 2023

(65) Prior Publication Data

US 2023/0222978 A1 Jul. 13, 2023

(30) Foreign Application Priority Data

Aug. 26, 2022 (CN) .......................... 202211032688.2

(51) Int. Cl.
*G09G 3/3241* (2016.01)
*G09G 3/3233* (2016.01)
*G11C 19/28* (2006.01)

(52) U.S. Cl.
CPC ......... *G09G 3/3233* (2013.01); *G11C 19/287* (2013.01); *G09G 2300/0426* (2013.01);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS

2020/0402458 A1* 12/2020 Gao ..................... G09G 3/3233
2022/0180810 A1* 6/2022 Zhang .................. G09G 3/3241

FOREIGN PATENT DOCUMENTS

| CN | 111710300 A | 9/2020 |
| CN | 112102785 A | 12/2020 |
| CN | 113643664 A | 11/2021 |

OTHER PUBLICATIONS

Office Action mailed Mar. 15, 2024, issued in corresponding Chinese Application No. 202211032688.2, filed Aug. 26, 2022, 10 pages.

* cited by examiner

*Primary Examiner* — Abdul-Samad A Adediran
(74) *Attorney, Agent, or Firm* — CHRISTENSEN O'CONNOR JOHNSON KINDNESS PLLC

(57) ABSTRACT

A pixel driving circuit, a display panel and a driving method therefor, and a display device, related to the display field and aiming to enable the pixel driving circuit to work in different operating modes to adapt to various application scenarios. The pixel driving circuit includes a driving transistor, a gate writing module and a control module. The control module and the gate writing module are connected in series on a function signal transmission path between a function signal terminal and a gate electrode of the driving transistor, and the gate writing module is configured to provide a function signal at the function signal terminal to the gate electrode of the driving transistor. An operating process of the pixel driving circuit includes a stage in which the gate writing module is turned on and the control module is turned off.

18 Claims, 16 Drawing Sheets

(52) U.S. Cl.
CPC ............... *G09G 2300/0819* (2013.01); *G09G 2300/0842* (2013.01); *G09G 2300/0861* (2013.01); *G09G 2310/0202* (2013.01); *G09G 2310/0286* (2013.01); *G09G 2310/08* (2013.01)

(58) Field of Classification Search
CPC ... G09G 2300/0861; G09G 2310/0202; G09G 2310/0286; G09G 2310/08; G09G 3/3241; G11C 19/287
See application file for complete search history.

Providing a non-enable signal to at least part of the control signal lines by using the control driving circuit — S1

PIXEL DRIVING CIRCUIT, DISPLAY PANEL AND DRIVING METHOD THEREFOR, AND DISPLAY DEVICE

CROSS-REFERENCE TO RELATED APPLICATIONS

The present application claims priority to Chinese Patent Application No. 202211032688.2, filed on Aug. 26, 2022, the content of which is incorporated herein by reference in its entirety.

TECHNICAL FIELD

The present disclosure relates to the field of display technology, in particular to a pixel driving circuit, a display panel and a driving method therefor, and a display device.

BACKGROUND

Organic light-emitting diode (OLED) display panels have gradually become the mainstream display technology for mobile phones, televisions, computers and other displays due to its characteristics of self-illumination, fast response, wide color gamut, large viewing angle, and high brightness.

OLEDs are current-driven devices. When the OLED emits light, a driving transistor in a pixel driving circuit needs to be controlled to provide a driving current to the OLED device, to allow the OLED device to emit light. The existing pixel driving circuits each has a relatively simple operating mode, which cannot adapt to different application scenarios.

SUMMARY

In view of this, the embodiments of the present disclosure provide a pixel driving circuit, a display panel and a driving method therefor, and a display device, aiming to enable the pixel driving circuit to work in different operating modes to adapt to various application scenarios.

In an aspect, an embodiment of the present disclosure provides a pixel driving circuit, including: a driving transistor, a gate writing module and a control module. The control module and the gate writing module are connected in series on a function signal transmission path between a function signal terminal and a gate electrode of the driving transistor, and the gate writing module is configured to provide a function signal at the function signal terminal to the gate electrode of the driving transistor. An operating process of the pixel driving circuit includes a stage in which the gate writing module is turned on and the control module is turned off.

In another aspect, an embodiment of the present disclosure provides a display panel, including: a plurality of pixel driving circuits describe above; a control signal line electrically connected to a control terminal of the control module; and a control driving circuit electrically connected to the control signal line.

In still another aspect, an embodiment of the present disclosure provides a driving method for driving the display panel described above. The driving method includes providing a non-enable signal to each of at least part of the control signal lines by using the control driving circuit.

In yet another aspect, an embodiment of the present disclosure provides a display device including the display panel described above.

BRIEF DESCRIPTION OF DRAWINGS

In order to better illustrate technical solutions in embodiments of the present disclosure, the accompanying drawings used in the embodiments are briefly introduced as follows. It should be noted that the drawings described as follows are merely part of the embodiments of the present disclosure, and other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there may be three relationships, for example, A and/or B may indicate that three cases, i.e., An existing individually, A and B existing simultaneously, B existing individually. In addition, the character "/" herein generally indicates that the related objects before and after the character form an "or" relationship.

Figure 1:
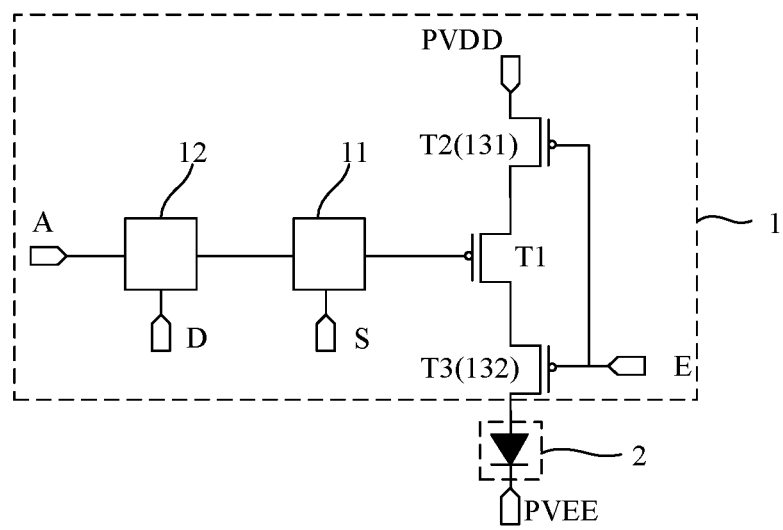
FIG. 1 is an equivalent circuit diagram of a pixel driving circuit and a light-emitting element according to an embodiment of the present disclosure.

An embodiment of the present disclosure provides a pixel driving circuit, and the pixel driving circuit is electrically connected to a light-emitting element to drive the light-emitting element to emit light. FIG. 1 is an equivalent circuit diagram of a pixel driving circuit 1 and a light-emitting element 2 according to an embodiment of the present disclosure. In an example, as shown in FIG. 1, the pixel driving circuit 1 includes a driving transistor T1, a gate writing module 11 and a control module 12. The control module 12 and the gate writing module 11 are connected in series on a function signal transmission path between a function signal terminal A and a gate electrode of the driving transistor T1. In an example, a control terminal of the gate writing module 11 is electrically connected to a scan signal terminal S, and a control terminal of the control module 12 is electrically connected to a control signal terminal D. During an operating process of the pixel driving circuit 1, signals provided by the scan signal terminal S and the control signal terminal D are different from each other at least in some stages.

In an example, as shown in FIG. 1, the pixel driving circuit 1 further includes a first light-emitting control module 131 and a second light-emitting control module 132.

In an embodiment, as shown in FIG. 1, the first light-emitting control module 131 includes a first light-emitting control transistor T2, and the second light-emitting control module 132 includes a second light-emitting control transistor T3. In an embodiment, each of a gate electrode of the first light-emitting control transistor T2 and a gate electrode of the second light-emitting control transistor T3 may be electrically connected to a light-emitting control signal terminal E.

In the embodiments of the present disclosure, the operating modes of the pixel driving circuit 1 include a first mode and a second mode.

Figure 2:
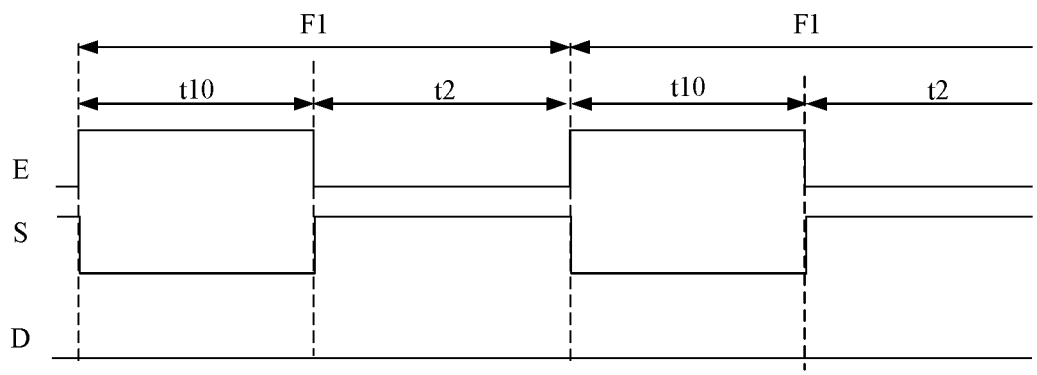
FIG. 2 is an operating time-sequence diagram of a pixel driving circuit in a first mode according to an embodiment of the present disclosure.

FIG. 2 is an operating time-sequence diagram of a pixel driving circuit in a first mode according to an embodiment of the present disclosure. In an example, as shown in FIG. 2, in the first mode, an operating process of the pixel driving circuit 1 includes a data input stage F1, and the data input stage F1 includes a function period t10 and a lighting period t2.

In the function period t10, the scan signal terminal S provides an enable level, the control signal terminal D provides an enable level, the light-emitting control signal terminal E provides a non-enable level, the gate writing module 11 and the control module 12 are both turned on, the first light-emitting control module 131 and the second light-emitting control module 132 are turned off, and a function signal provided by the function signal terminal A is input to the gate electrode of the driving transistor T1. For example, in the function period t10, the gate electrode of the driving transistor T1 may be charged or reset.

In the light-emitting period t2, at least one of the scan signal terminal S and the control signal terminal D provides a non-enable level, the light-emitting control signal terminal E provides an enable level, at least one of the gate writing module 11 and the control module 12 is turned off, the first light-emitting control module 131 and the second light-emitting control module 132 are both turned on, and the pixel driving circuit 1 controls the light-emitting element 2 to emit light. In an example, as shown in FIG. 2, the enable level is a low level, the non-enable level is a high level, and the control signal terminal D constantly provides an enable level in the function period t10 and in the light-emitting period t2. Unless otherwise specified below, the embodiments of the present disclosure are described with the enable level being a low level and the non-enable level being a high level. It can be understood that, in some other embodiments, the enable level may be a high level, and the non-enable level may be a low level.

It should be understood that in the light-emitting period t2 shown in FIG. 2, it is only an example that the scan signal terminal S provides a non-enable level and the control signal terminal D provides an enable level. In other examples, in the light-emitting period t2, each of the scan signal terminal S and the control signal terminal D may provide a non-enable level, or the scan signal terminal S provides an enable level and the control signal terminal D provides a non-enable level. The present disclosure does not limit thereto.

In an embodiment, as shown in FIG. 2, in the first mode, the work of the above data input stage F1 can be repeated, so that the pixel driving circuit 1 performs driving at a relatively high frequency.

In an example, in the second mode, in addition to the data input stage F1, the operating process of the pixel driving circuit 1 may further include a data maintaining stage. Within a display cycle of one frame image, the data maintaining stage is after the data input stage F1. In an example, in the second mode, the operation performed by the pixel driving circuit 1 in the data input stage F1 may be the same as that performed in the data input stage F1 in the first mode.

In an example, in the embodiments of the present disclosure, the second mode includes a first sub-mode, and the data maintaining stage includes a first data retention stage corresponding to the first sub-mode.

Figure 3:
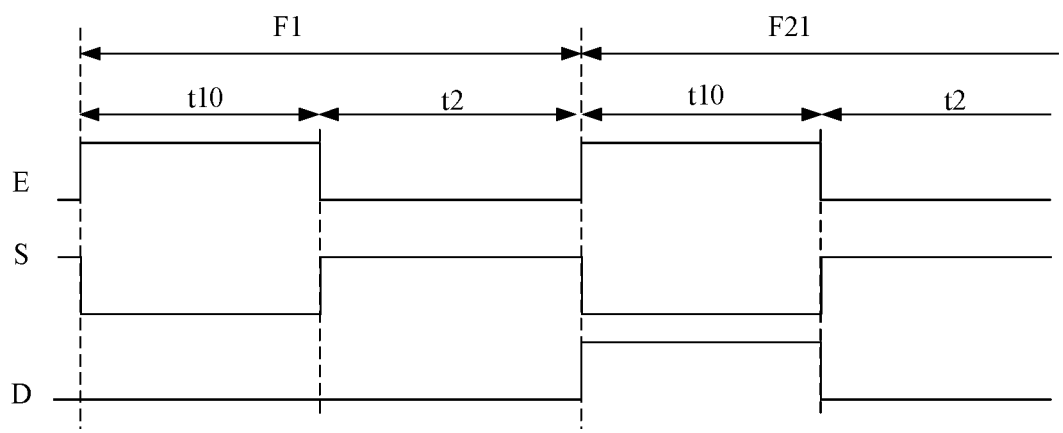
FIG. 3 is an operating time-sequence diagram of a pixel driving circuit in a first sub-mode according to an embodiment of the present disclosure.

FIG. 3 is an operating time-sequence diagram of a pixel driving circuit in a first sub-mode according to an embodiment of the present disclosure. In an embodiment, as shown in FIG. 3, the operating process of pixel driving circuit 1 includes a data input stage F1 and a first data retention stage F21. In a display cycle of one frame image, the first data retention stage F21 is after the data input stage F1.

In an example, the first data retention stage F21 includes a function period t10 and a light-emitting period t2.

In the function period t10 of the first data retention stage F21, the scan signal terminal S provides an enable level, the control signal terminal D provides a non-enable level, the light-emitting control signal terminal E provides a non-enable level, the gate writing module 11 is turned on and the control module 12 is turned off, the first light-emitting control module 131 and the second light-emitting control module 132 are turned off, and a function signal provided by the function signal terminal A is not input to the gate electrode of the driving transistor T1.

In the light-emitting period t2 of the first data retention stage F21, at least one of the scan signal terminal S and the control signal terminal D provides a non-enable level, the light-emitting control signal terminal E provides an enable level, at least one of the gate writing module 11 and the control module 12 is turned off, the first light-emitting control module 131 and the second light-emitting control module 132 are turned on, a current flows through the driving transistor T1, and the pixel driving circuit 1 controls the light-emitting element 2 to emit light. FIG. 3 shows an example that in the light-emitting period t2 of the first data retention stage F21, the scan signal terminal S provides a non-enable level, and the control signal terminal D provides an enable level. As shown in FIG. 3, it is only an example that in the light-emitting period t2 of the first data retention stage F21, the scan signal terminal S provides a non-enable level, and the control signal terminal D provides an enable level. In other examples, in the light-emitting period t2 of the first data retention stage F21, each of the scan signal terminal S and the control signal terminal D may provide a non-enable level, or the scan signal terminal S may provide an enable level and the control signal terminal D may provide a non-enable level. The present disclosure does not limit thereto.

In the light-emitting period t2 of the first data retention stage F21, the gate electrode of the driving transistor T1 can maintain the data signal input in the data input stage F1, to generate a current between a first electrode and a second electrode of the driving transistor T1 corresponding to the data signal, thereby driving a light-emitting element electrically connected to the pixel driving circuit to emit light with a brightness corresponding to the data signal.

Figure 4:
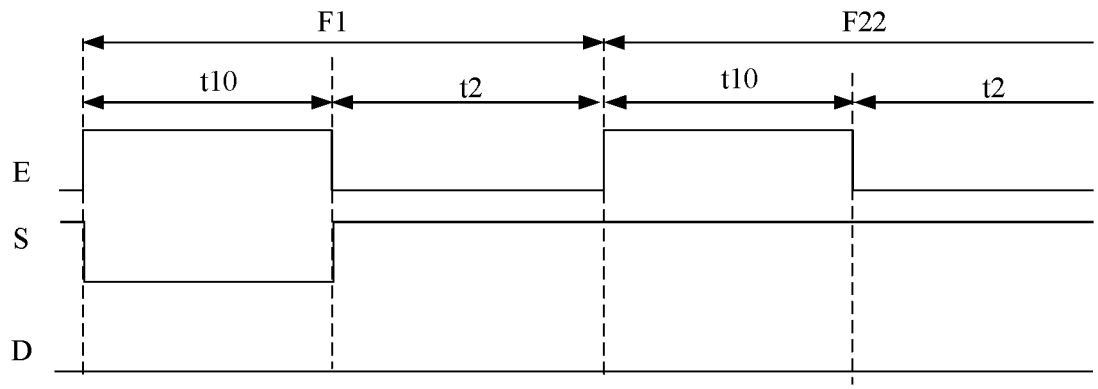
FIG. 4 is an operating time-sequence diagram of a pixel driving circuit in a second sub-mode according to an embodiment of the present disclosure.

In an embodiment of the present disclosure, the second mode may further include a second sub-mode, and the data maintaining stage includes a second data retention stage corresponding to the second sub-mode. The second data retention stage includes a function period and a light-emitting period. FIG. 4 is an operating time-sequence diagram of a pixel driving circuit in a second sub-mode according to an embodiment of the present disclosure. As shown in FIG. 4, in the function period t10 of the second data retention stage F22, the scan signal terminal S provides a non-enable level, the control signal terminal D provides an enable level or a non-enable level, the light-emitting control signal terminal E provides a non-enable level, the gate writing module 11 is turned off, the first light-emitting control module 131 and the second light-emitting control module 132 are turned off, and a function signal provided by the function signal terminal A is not input to the gate electrode of the driving transistor T1.

In the light-emitting period t2 of the second data retention stage F22, at least one of the scan signal terminal S and the control signal terminal D provides a non-enable level, the light-emitting control signal terminal E provides an enable level, at least one of the gate writing module 11 and control module 12 is turned off, each of the first light-emitting control module 131 and the second light-emitting control module 132 is turned on, a current flows through the driving transistor T1, and the pixel driving circuit 1 controls the light-emitting element 2 to emit light. FIG. 4 shows an example where the second data retention stage F22, the control signal terminal D constantly provides an enable level. As shown in FIG. 4, in the light-emitting period t2 of the second data retention stage F22, the scan signal terminal S provides a non-enable level, and the control signal terminal D provides an enable level. In other examples, in the light-emitting period t2 of the second data retention stage F22, each of the scan signal terminal S and the control signal terminal D may provide a non-enable level, or, the scan signal terminal S may provide an enable level and the control signal terminal D may provide a non-enable level. The present disclosure does not limit thereto.

In an example, in the embodiments of the present disclosure, a frequency of a scan signal that controls the gate writing module 10 in the first sub-mode is greater than a frequency of a scan signal that controls the gate writing module 10 in the second sub-mode. The frequency of the scan signal that controls gate writing module 10 in the first mode may be the same as the frequency of the scan signal that controls the gate writing module 10 in the first sub-mode.

The pixel driving circuit provided by the embodiments of the present disclosure can flexibly select different operating modes according to different application scenarios. For example, when the pixel driving circuit needs to participate in displaying images with a high refresh rate, the pixel driving circuit 1 can work in the first mode; and when the pixel driving circuit needs to participate in displaying images with a low refresh rate, the pixel driving circuit 1 can work in the second mode. Moreover, when the pixel driving circuit 1 needs to display mages with a low refresh rate, the embodiments of the present disclosure can allow the pixel driving circuit 1 to be flexibly selected between the first sub-mode and the second sub-mode according to the frequency of the scan signal provided to the pixel driving circuit 1. In the first sub-mode, in a display cycle of one frame image, according to the pixel driving circuit 1 provided by the embodiments of the present disclosure, by configuring the gate writing module 11 to be turned on and the control module 12 to be turned off in the first data retention stage, the number of function signals input to the gate electrode of the driving transistor T1 can be reduced, and a bias state of the driving transistor T1 in the first sub-mode can be consistent with a bias state of the driving transistor T1 in the second sub-mode, so that a light-emitting state of the light-emitting element 2 driven by the pixel driving circuit 1 in the first sub-mode tends to be consistent with a light-emitting state of the light-emitting element 2 driven by the pixel driving circuit 1 in the second sub-mode.

It should be noted that it is only an example that the control module 12 shown in FIG. 1 is arranged between the function signal terminal A and the gate writing module 11. In other examples, the gate writing module 11 may be arranged between the function signal terminal A and the control module 12. The present disclosure does not limit thereto.

Figure 5:
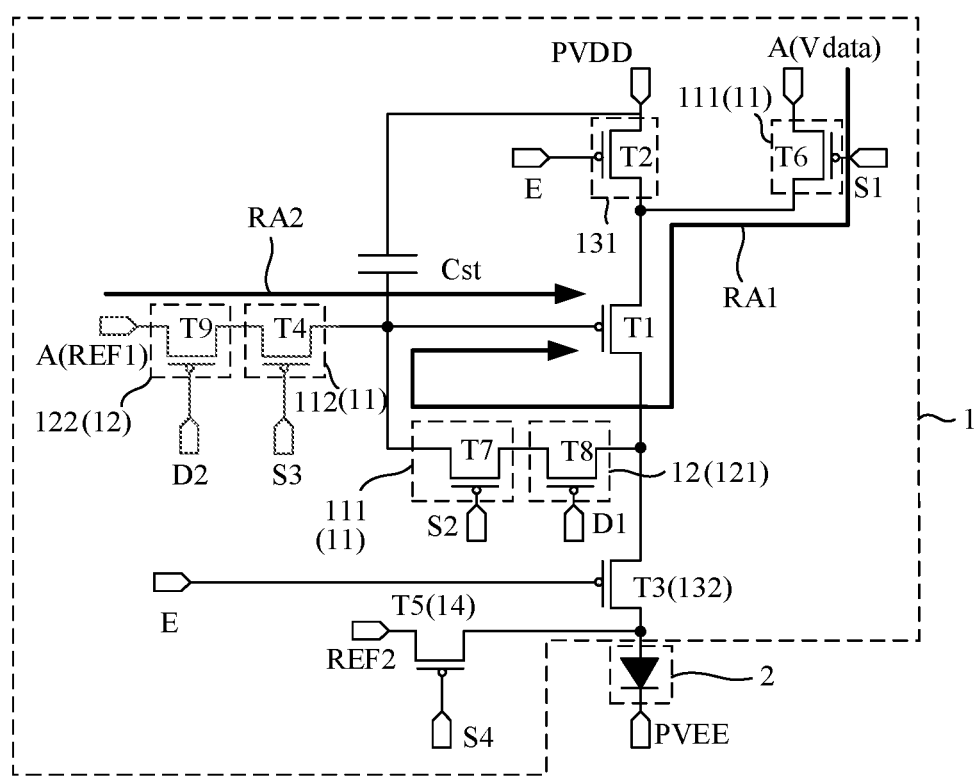
FIG. 5 is a circuit diagram of another pixel driving circuit according to an embodiment of the present disclosure.

FIG. 5 is a circuit diagram of another pixel driving circuit according to an embodiment of the present disclosure. In an example, as shown in FIG. 5, the pixel driving circuit 1 includes a data signal terminal Vdata, a data writing module 111, a first reset signal terminal REF1, a gate reset module 112, a second reset signal terminal REF2, and a light-emitting element reset module 14. The data signal terminal Vdata is electrically connected to the gate electrode of the driving transistor T1 through data writing module 111. The first reset signal terminal REF1 is electrically connected to the gate electrode of the driving transistor T1 through gate reset module 112. The second reset signal terminal REF2 is electrically connected to the light-emitting element 2 through the light-emitting element reset module 14.

In an example, as shown in FIG. 5, the gate reset module 112 includes a gate reset transistor T4, including a gate electrode electrically connected to a third scan signal terminal S3, a first electrode electrically connected to the first reset signal terminal REF1, and a second electrode electrically connected to the gate electrode of the driving transistor T1.

The light-emitting element reset module 14 includes a light-emitting element reset transistor T5, including a gate electrode electrically connected to a fourth scan signal terminal S4, a first electrode electrically connected to the second reset signal terminal REF2, and a second electrode electrically connected to the light-emitting element 2.

The data writing module 111 includes a data writing transistor T6 and a threshold compensation transistor T7. A gate electrode of the data writing transistor T6 is electrically connected to the first scan signal terminal S1, and a gate electrode of the threshold compensation transistor T7 is electrically connected to the second scan signal terminal S2. A first electrode of the data writing transistor T6 is electrically connected to the data signal terminal $V_{data}$, and a second electrode of the data writing transistor T6 is electrically connected to the first electrode of the driving transistor T1. A first electrode of the threshold compensation transistor T7 is electrically connected to the second electrode of the driving transistor T1. A second electrode of the threshold compensation transistor T7 is electrically connected to the gate electrode of the driving transistor T1.

In an example, as shown in FIG. 5, the pixel driving circuit further includes a storage capacitor $C_{st}$, including a first electrode electrically connected to the gate electrode of the driving transistor T1, and a second electrode electrically connected to the first power supply voltage terminal PVDD.

Figure 6:
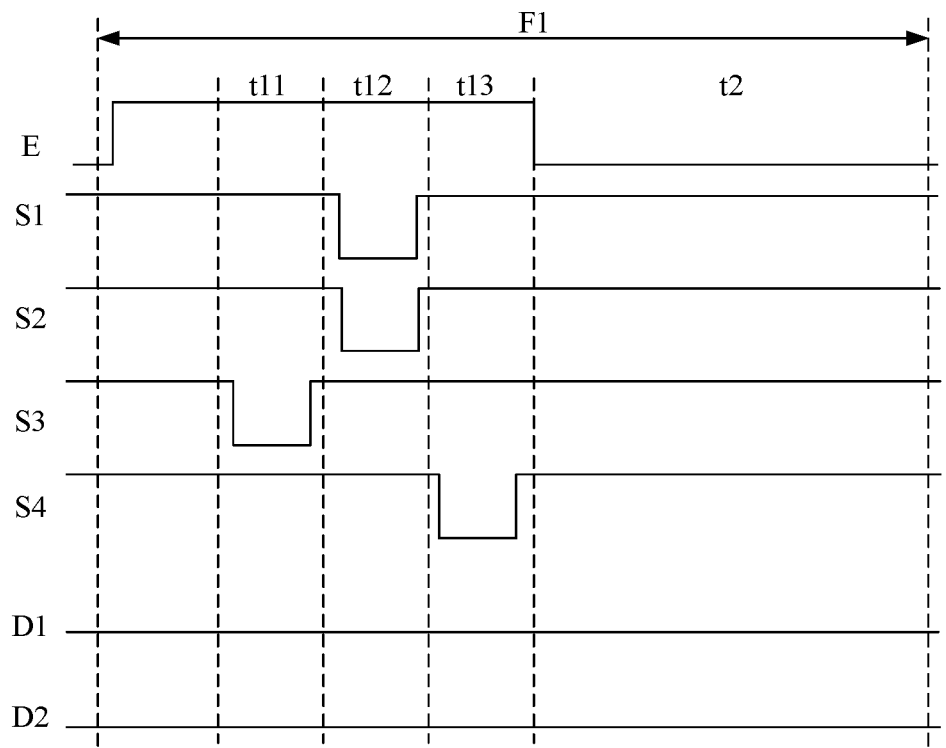
FIG. 6 is an operating time-sequence diagram of the pixel driving circuit shown in FIG. 5 in a data input stage.

FIG. 6 is an operating time-sequence diagram of the pixel driving circuit shown in FIG. 5 in a data input stage. In an example, as shown in FIG. 6, in the data input stage F1, the operating process of the pixel driving circuit 1 includes a gate reset period t11, a charging period t12 and a light-emitting element reset period t13. The gate reset period t11 is before the charging period t12.

In the gate reset period 11, the gate reset module 112 is turned on, and the first reset signal terminal REF1 inputs a first reset signal to the gate electrode of the driving transistor T1 through the gate reset module 112. The configuration of the gate reset period 11 can clear the data input to the gate electrode of driving transistor T1 in the display cycle of a previous one image frame, thereby ensuring the accuracy of the data input for a current frame image.

In the charging period t12, the data writing module 111 is turned on, and the data signal terminal $V_{data}$ charges the gate electrode of the driving transistor T1 through the data writing module 111.

In the light-emitting element reset period t13, the light-emitting element reset module 14 is turned on, and the second reset signal terminal REF2 inputs a second reset signal to the light-emitting element 2 through the light-emitting element reset module 14, thereby avoiding that the light-emitting element 2 emits light in this stage.

In an embodiment of the present disclosure, the function signal terminal A includes a data signal terminal $V_{data}$ and/or a first reset signal terminal REF1. The gate writing module 11 includes a data writing module 111 and/or a gate reset module 112. The function period t10 includes a gate reset period 11 and a charging period t12. FIG. 5 is a schematic diagram showing that the gate writing module 11 includes a data writing module 111 and a gate reset module 112.

As shown in FIG. 5, when the gate writing module 11 includes a data writing module 111, the control module 12 includes a first control sub-module 121, and the first control sub-module 121 and the data writing module 111 are connected in series on a data signal transmission path between the data signal terminal $V_{data}$ and the gate electrode of the driving transistor T1. In FIG. 5, the data signal transmission path RA1 is schematically indicated by an arrow. The control signal terminal D includes a first control signal sub-terminal D1 electrically connected to a control terminal of the first sub-control module 121.

Figure 7:
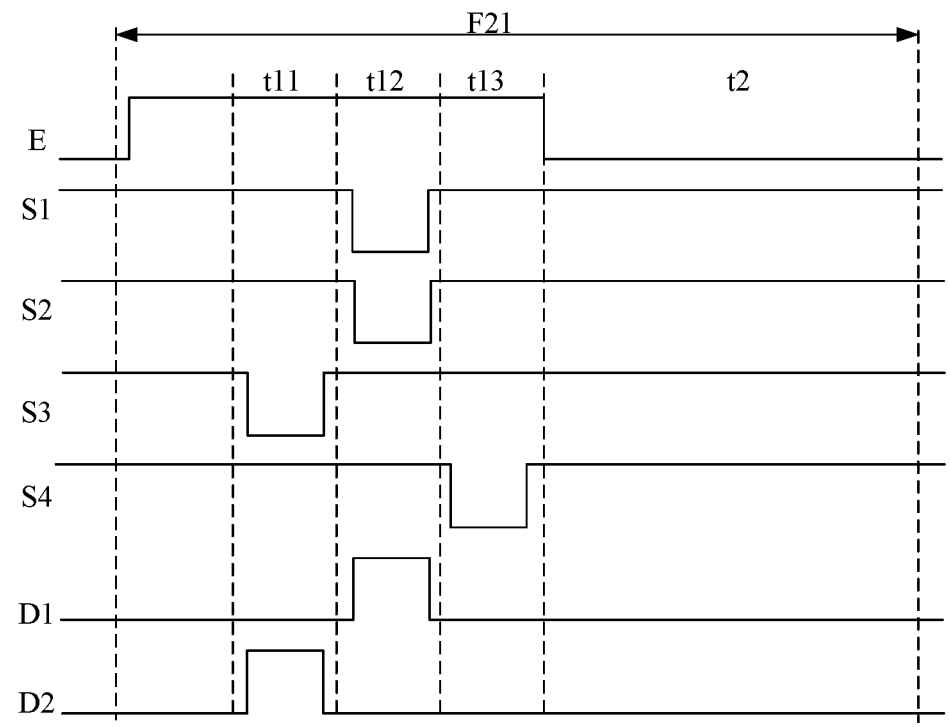
FIG. 7 is an operating time-sequence diagram of the pixel driving circuit shown in FIG. 5 in a first data retention stage.

FIG. 7 is an operating time-sequence diagram of the pixel driving circuit shown in FIG. 5 in a first data retention stage F21. In an example, as shown in FIG. 7, in the first data retention stage F21, the function period includes a charging period t12. At least one of the first scan signal terminal S1 and the second scan signal terminal S2 provides an enable level in the charging period t12, and the first control signal sub-terminal D1 provides a non-enable level in the charging period t12.

In the embodiments of the present disclosure, the first control sub-module 121 may be configured in various manners.

In an embodiment, as shown in FIG. 5, the first control sub-module 121 is arranged between the first electrode of the threshold compensation transistor T7 and the second electrode of the driving transistor T1. Such a configuration can prevent the first control sub-module 121 from being directly connected to the gate electrode of the driving transistor T1. When the first control sub-module 121 is adjusted through the first control signal sub-terminal D1 to switch the first control sub-module 121 between different operating states, it can avoid affecting a potential of the gate electrode of the driving transistor T1, thereby being beneficial to improve the stability of the potential of the gate electrode of the driving transistor T1.

Figure 8:
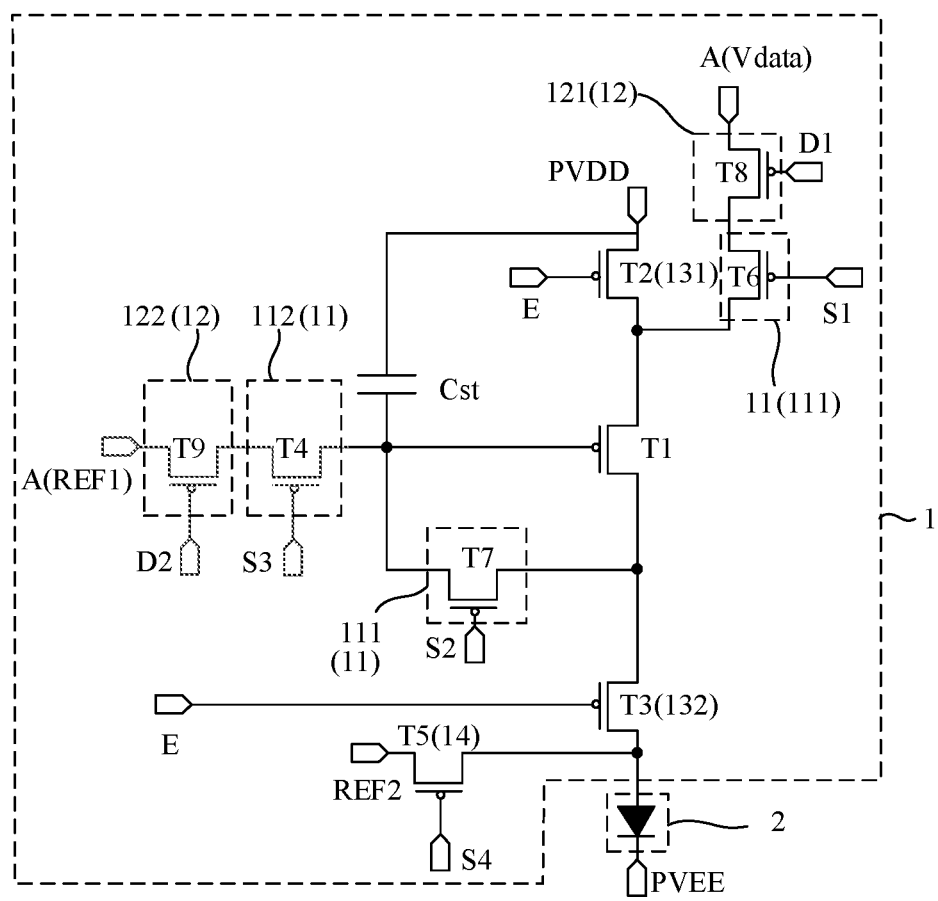
FIG. 8 is a circuit diagram of another pixel driving circuit according to an embodiment of the present disclosure.

FIG. 8 is a circuit diagram of another pixel driving circuit according to an embodiment of the present disclosure. In an example, as shown in FIG. 8, in an embodiment of the present disclosure, the first control sub-module 121 may be arranged between the data signal terminal $V_{data}$ and the data writing transistor T6.

Figure 9:
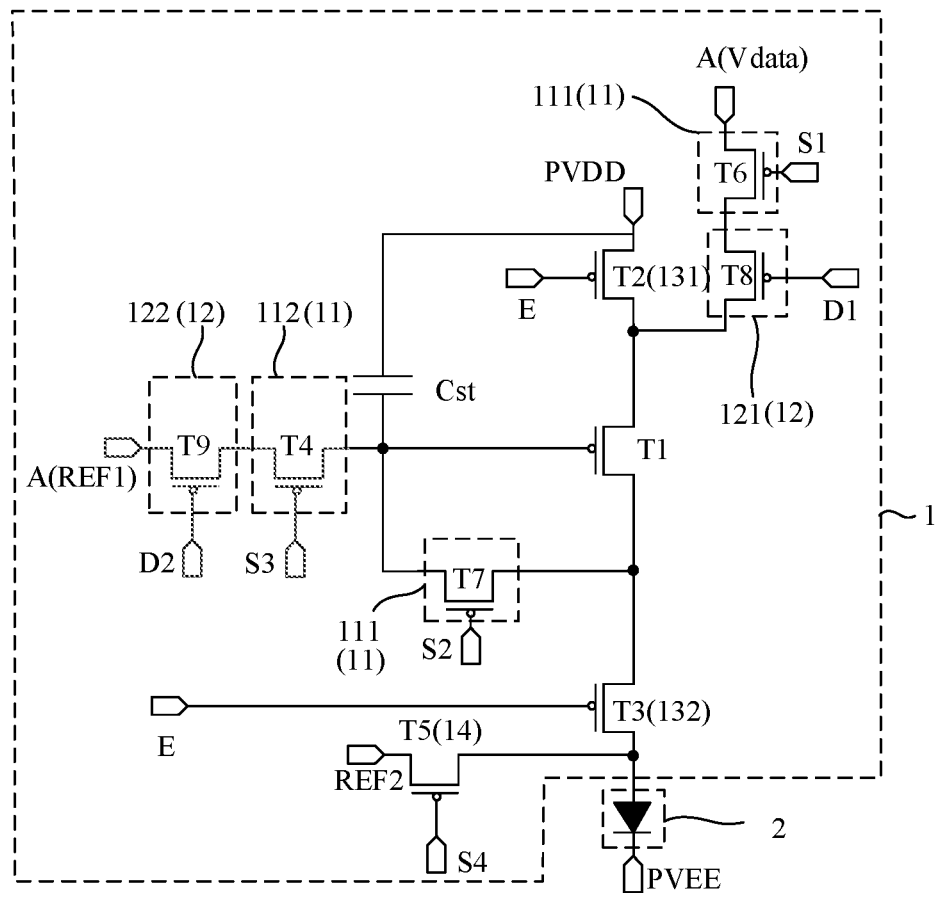
FIG. 9 is a circuit diagram of another pixel driving circuit according to an embodiment of the present disclosure.

FIG. 9 is a circuit diagram of another pixel driving circuit according to an embodiment of the present disclosure. In an embodiment, as shown in FIG. 9, the first control sub-module 121 may be arranged between the second electrode of the data writing transistor T6 and the first electrode of the driving transistor T1.

In an example, as shown in FIG. 5, FIG. 8, and FIG. 9, the first control sub-module 121 includes a first control sub-transistor T8. A gate electrode of the first control sub-transistor T8 is electrically connected to the first control signal sub-terminal D1. In an example, the first control sub-transistor T8 may be a P-type transistor, an enable level provided by the first control signal sub-terminal D1 is a low level, and a non-enable level provided by the first control signal sub-terminal D1 is a high level. Alternatively, the first control sub-transistor T8 may be an N-type transistor, an enable level provided by the first control signal sub-terminal D1 is a high level, and a non-enable level provided by the first control signal sub-terminal D1 is a low level. In the embodiments of the present disclosure, unless otherwise specified, the first control sub-transistor T8 is a P-type transistor, an enable level provided by the first control signal sub-terminal D1 is a low level, and a non-enable level provided by the first control signal sub-terminal D1 is a high level.

As shown in FIG. 9, the first electrode of the driving transistor T1 is electrically connected to a second electrode light-emitting tube of the first light-emitting control transistor T2 and the first control sub-transistor T8 respectively, so as to avoid that the first control sub-transistor T8 is arranged on a signal transmission path between the first light-emitting control transistor T2 and the driving transistor T1. In this way, it can ensure that the light-emitting element 2 emits light normally in the first data retention stage F21.

In an embodiment, as shown in FIG. 5, FIG. 8 and FIG. 9, the gate writing module 11 may include a gate reset module 112, and the control module 12 may include a second control sub-module 122. The second control sub-module 122 and the gate reset module 112 are connected in series on a first reset signal transmission path between the first reset signal terminal REF1 and the gate electrode of the driving transistor T1. In FIG. 5, the first reset signal transmission path RA2 is indicated by an arrow. The control signal terminal D includes a second control signal sub-terminal D2 electrically connected to the control terminal of the second control sub-module 122.

In an example, as shown in FIG. 7, in the first data retention stage F21, the function period includes a gate reset period 11. The third scan signal terminal S3 provides an enable level in the gate reset period 11. The second control signal sub-terminal D2 provides a non-enable level in the gate reset period 11.

In an example, as shown in FIG. 5, FIG. 8 and FIG. 9, the second control sub-module 122 includes a second control sub-transistor T9. A gate electrode of the second control sub-transistor T9 is electrically connected to the second control signal sub-terminal D2. In an example, the second control sub-transistor T9 may be a P-type transistor, an enable level provided by the second control signal sub-terminal D2 is a low level, and a non-enable level provided by the second control signal sub-terminal D2 is a high level. Alternatively, the second control sub-transistor T9 may be an N-type transistor, an enable level provided by the second control signal sub-terminal D2 is a high level, and a non-enable level provided by the second control signal sub-terminal D2 is a low level. In the embodiments of the present disclosure, unless otherwise specified, the second control sub-transistor T9 is a P-type transistor, an enable level provided by the second control signal sub-terminal D2 is a low level, and a non-enable level provided by the second control signal sub-terminal D2 is a high level.

In an embodiment of the present disclosure, when configuring the second control sub-module 122, for example, the second control sub-module 122 may be arranged between the gate reset module 112 and the gate electrode of the driving transistor T1.

In an example, as shown in FIG. 5, FIG. 8 and FIG. 9, the gate reset module 112 may be arranged between the gate electrode of the second control sub-module 122 and the driving transistor T1, that is, the second control sub-module 122 may be electrically connected to the gate electrode of the driving transistor T1 through the gate reset module 112. Such a configuration can prevent the second control sub-module 122 from being directly connected to the gate electrode of the driving transistor T1. When the second control sub-module 122 is adjusted through the second control signal sub-terminal D2 to switch the second control sub-module 122 between different operating states, it can avoid affecting the potential of the gate electrode of the driving transistor T1, thereby being beneficial to improve the stability of the potential of the gate electrode of the driving transistor T1.

Figure 10:
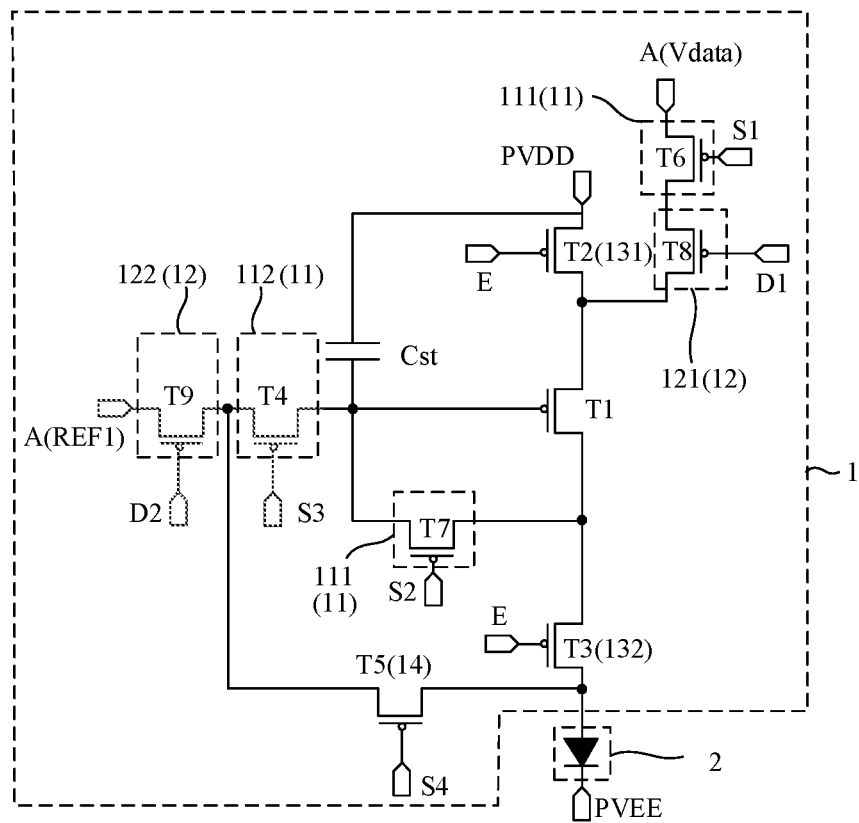
FIG. 10 is a circuit diagram of another pixel driving circuit according to an embodiment of the present disclosure.

FIG. 10 is a circuit diagram of another pixel driving circuit according to an embodiment of the present disclosure. In an embodiment, as shown in FIG. 10, the first reset signal terminal REF1 is reused as a second reset signal terminal REF2, and the second electrode of the second control sub-module 122 is electrically connected to the light-emitting element reset module 14. In such a configuration, in the data input stage F1, in the light-emitting element reset period t13, the second control sub-module 122 and the light-emitting element reset module 14 may be both turned on, so as to input a first reset signal to the light-emitting element 2 through the second control sub-module 122 and the light-emitting element reset module 14, thereby resetting the light-emitting element 2. In the first data retention stage F21, when the second control signal sub-terminal D2 controls the second control sub-module 122 to be turned off, it can avoid that the first reset signal REF1 is input to the light-emitting element 2.

When the pixel driving circuit includes at least two gate writing modules, the control terminals of the at least two gate writing modules are respectively electrically connected to at least two different scan signal terminals; and each of at least two gate writing modules are connected to the gate electrode of the driving transistor through a same control module. In such a configuration, it is beneficial to reduce the number of control modules in the pixel driving circuit.

Figure 11:
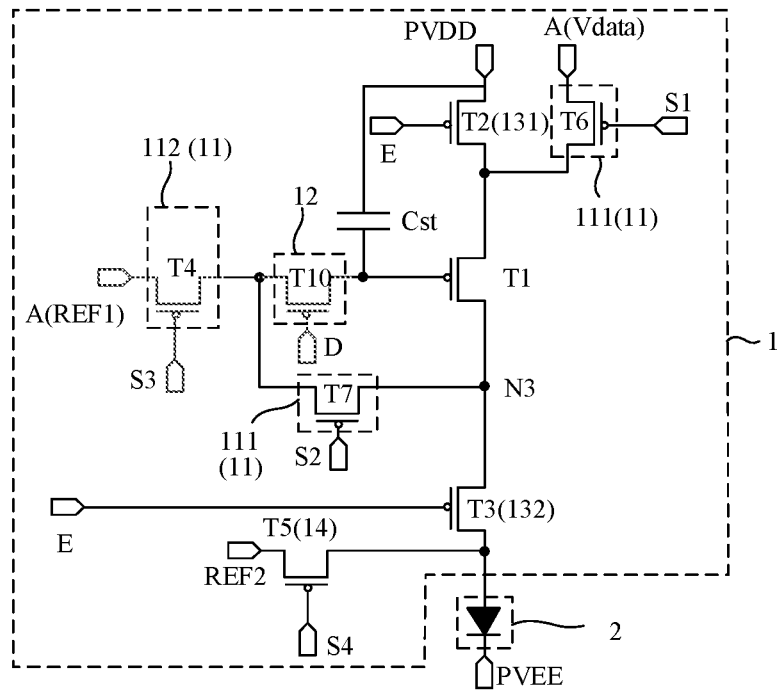
FIG. 11 is a circuit diagram of another pixel driving circuit according to an embodiment of the present disclosure.

FIG. 11 is a circuit diagram of another pixel driving circuit according to an embodiment of the present disclosure. As shown in FIG. 11, the pixel driving circuit 1 includes two gate writing modules 11. One of the two gate writing modules 11 is a data writing module 111, and the other one of the gate writing modules 11 is a gate reset module 112. Each of the data writing module 111 and the gate reset module 112 is electrically connected to the gate electrode of the driving transistor T1 through a same control module 12. Such a configuration is beneficial to reduce the number of control modules 12 in the pixel driving circuit. In an example, as shown in FIG. 11, the control module 12 includes a control transistor T10. Based on this configuration, only one control transistor T10 for forming the control module 12 may be provided in the pixel driving circuit, thereby reducing the number of transistors in the pixel driving circuit, and thus being beneficial to reduce an area of the pixel driving circuit.

Figure 12:
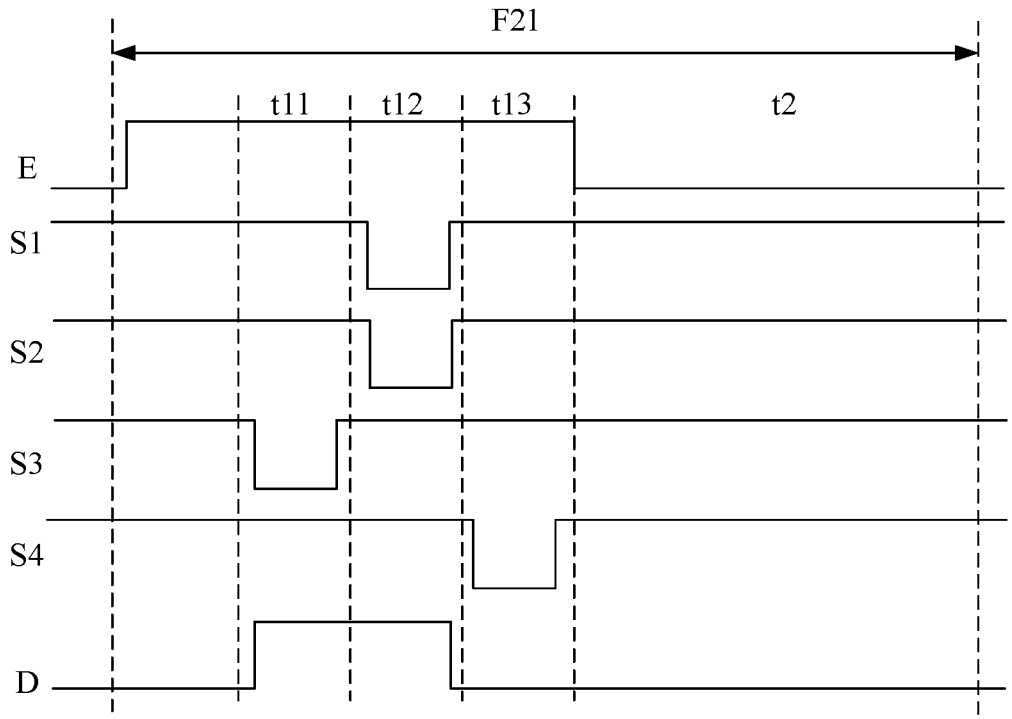
FIG. 12 is an operating time-sequence diagram of the pixel driving circuit shown in FIG. 11 in a first data retention stage.

In an example, the first data retention stage F21 includes at least two function periods. The scan signal terminal is configured to provide an enable level in a corresponding function period; the control signal terminal D is configured to provide a non-enable level in each of two function periods. Combined with FIG. 12, which is an operating time-sequence diagram of the pixel driving circuit shown in FIG. 11 in the first data retention stage F21, one of the function periods is a gate reset period t11 and another one of the function periods is a charging period t12, and one of the gate writing modules 11 is a data writing module 111 electrically connected to each of the first scan signal terminal Si and the second scan signal terminal S2 and another one of the gate writing modules 11 is a gate reset module 112 electrically connected to the third scan signal terminal S3. In the gate reset period t11, the third scan signal terminal S3 provides an enable level, and the control signal terminal D provides a non-enable level. In the charging period t12, at least one of the first scan signal terminal S1 and the second scan signal terminal S2 provides an enable level, and the control signal terminal D provides a non-enable level.

Figure 13:
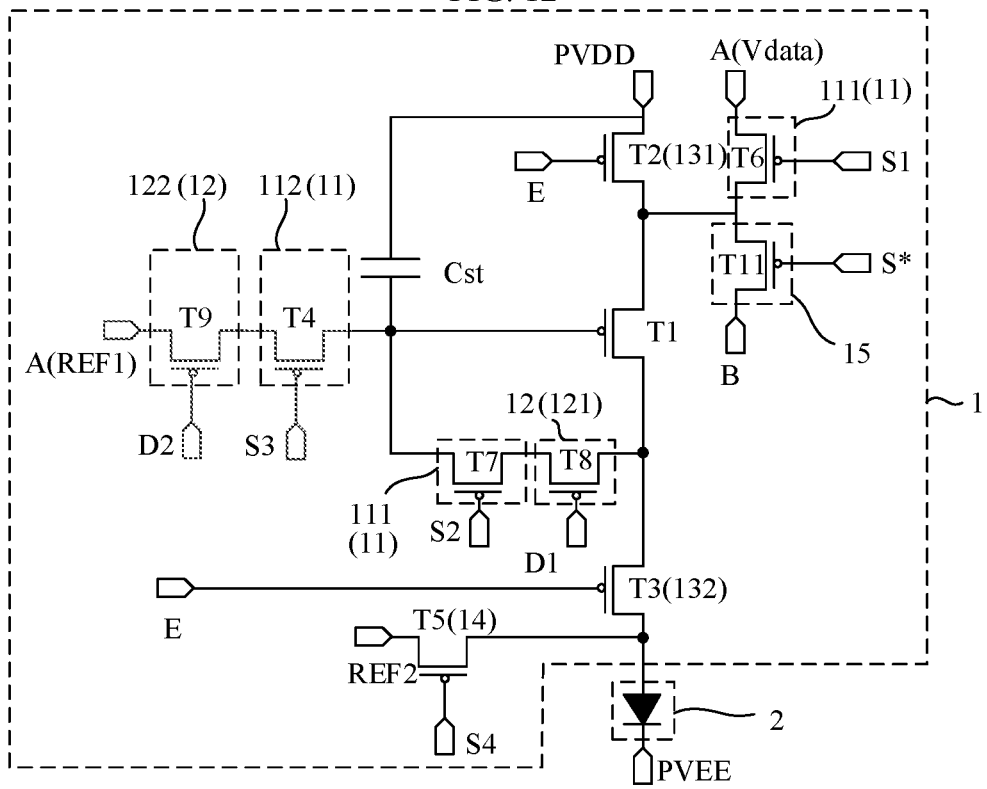
FIG. 13 is a circuit diagram of another pixel driving circuit according to an embodiment of the present disclosure.

FIG. 13 is a circuit diagram of another pixel driving circuit according to an embodiment of the present disclosure. In an example, as shown in FIG. 13, the pixel driving circuit 1 further includes an adjustment module 15, and a control terminal of the adjustment module 15 is electrically connected to an adjustment control terminal S*. The adjustment module 15 includes a terminal electrically connected to an adjustment signal terminal B, and another terminal electrically connected to the first electrode of the driving transistor T1 or the second electrode of the driving transistor T1. FIG. 13 shows an example where adjustment module 15 is electrically connected to the first electrode of the driving transistor T1.

Figure 14:
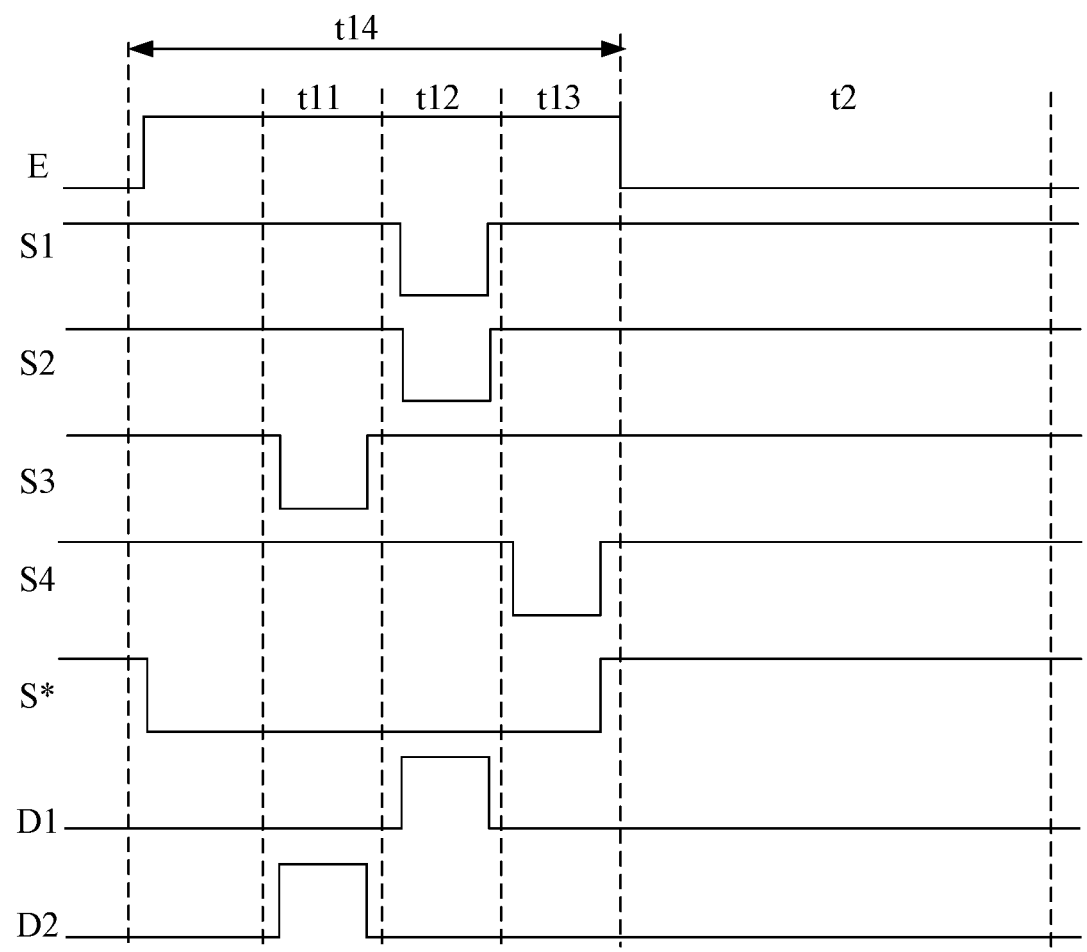
FIG. 14 is an operating time-sequence diagram of the pixel driving circuit shown in FIG. 13 in a first data retention stage.

FIG. 14 is an operating time-sequence diagram of the pixel driving circuit shown in FIG. 13 in a first data retention stage. As shown in FIG. 14, the operating process of the pixel driving circuit may further include an adjustment stage t14. The adjustment signal terminal B is configured to provide an adjustment signal to the first electrode of the driving transistor T1 or the second electrode of the driving transistor T1 in the adjustment state t14. The adjustment signal is configured to adjust a bias state of the driving transistor T1, so that the bias state of the driving transistor T1 in the data maintaining stage is consistent with the bias state of the driving transistor T1 in the data input stage F1. In the adjustment phase t14, the light-emitting control signal terminal E provides a non-enable level.

In an example, the data maintaining stage shown in FIG. 14 may be the first data retention stage or the second data retention stage described above. That is, in each of the first sub-mode and the second sub-mode, the pixel driving circuit provided by the embodiments of the present disclosure may perform the operation in the adjustment stage described above.

As shown in FIG. 13, the adjustment module 15 includes an adjustment transistor T11, including a gate electrode electrically connected to the adjustment control terminal S*, a first electrode electrically connected to the adjustment signal terminal B, and a second electrode electrically connected to the first electrode of the driving transistor T1 or the second electrode of the driving transistor T1. FIG. 13 merely shows an example where adjustment module 15 is electrically connected to the first electrode of the driving transistor T1.

In an embodiment, the first scan signal terminal Si provides an enable level in the adjustment stage t14, and the data signal terminal $V_{data}$ transmits an adjustment signal in the adjustment stage t14. With this configuration, in the adjustment stage t14, the adjustment signal provided by the data signal terminal $V_{data}$ can be input to the first electrode of the driving transistor T1 through the turned-on data writing transistor T6, so as to adjust the bias state of the driving transistor T1 in the adjustment stage. Based on this configuration, the data writing transistor T6 can be reused as the adjustment module 15 without needing to provide an additional transistor in the pixel driving circuit, thereby being beneficial to reduce the number of transistors in the pixel driving circuit. In the embodiments of the present disclosure, in the adjustment stage t14, the first control signal sub-terminal D1 provides a non-enable level, so as to prevent the adjustment signal input to the first electrode of the driving transistor T1 from affecting the potential of the gate electrode of the driving transistor T1.

Figure 15:
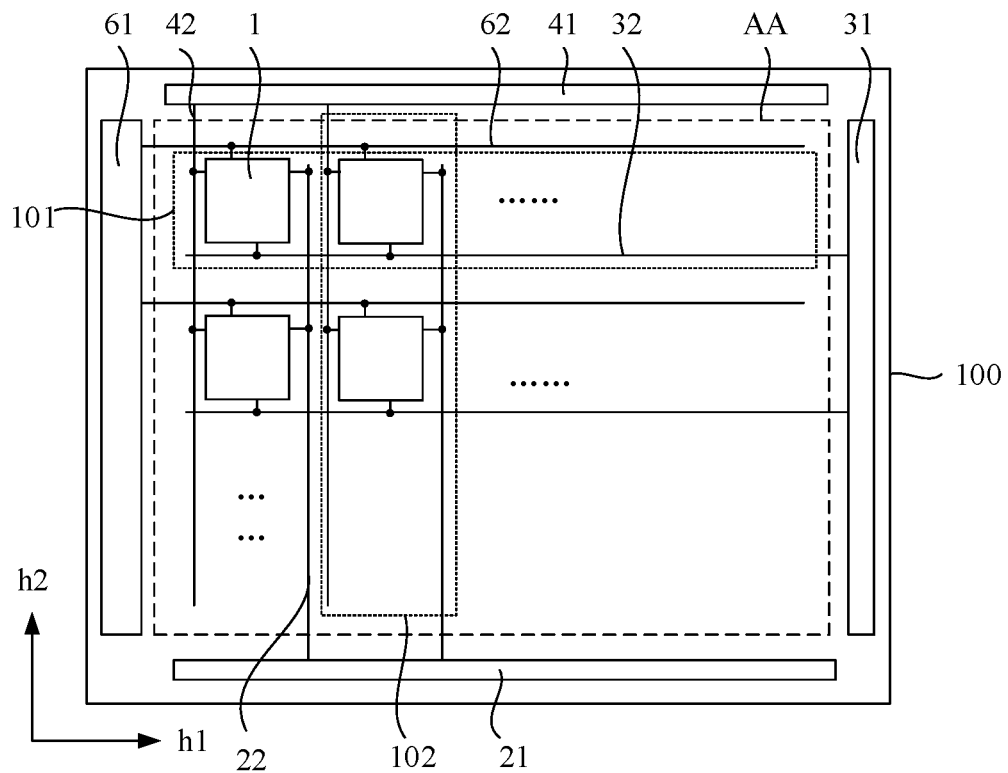
FIG. 15 is a schematic diagram of a display panel according to an embodiment of the present disclosure.

An embodiment of the present disclosure provides a display panel, as shown in FIG. 15, which is a schematic diagram of a display panel 100 according to an embodiment of the present disclosure, the display panel 100 has a display area AA and a non-display area NA.

The display area AA is provided with sub-pixels, each of which includes the light-emitting element and the pixel driving circuit 1 that are described above. The light-emitting element is electrically connected to the pixel driving circuit 1, and the pixel driving circuit 1 drives the light-emitting element to emit light. A structure of the pixel driving circuit 1 has been described in detail in the foregoing embodiments and will not be repeated herein.

As shown in FIG. 15, the pixel driving circuits 1 are arranged in an array in a first direction h1 and a second direction h2. The pixel driving circuits 1 arranged along the first direction h1 form a pixel driving circuit row 101. The pixel driving circuits 1 arranged along the second direction h2 form a pixel driving circuit column 102.

As shown in FIG. 15, the display panel 100 includes a scan driving circuit 61, a control driving circuit 21, a light-emitting driving circuit 31, a data driving circuit 41, control signal lines 22, gating signal lines and data lines 42. In an example, the gating signal lines include a scan line 62 and a light-emitting control line 32. At least part of the control signal line 22, the scan line 62, the light-emitting control line 32 and the data line 42 is located in the display area AA. The control driving circuit 21, the scan driving circuit 61, the light-emitting driving circuit 31 and the data driving circuit 41 are located in the non-display area NA. In an example, as shown in FIG. 15, the scan line 62 and the light-emitting control line 32 each extend along the first direction h1 and are arranged along the second direction h2. The control signal line 22 and the data line 42 each extend along the second direction h2 and are arranged along the first direction h1.

The scan driving circuit 61 is electrically connected to the scan line 62, and the control terminal of the gate writing module 11 in the pixel driving circuit 1 is electrically connected to the scan line 62. The scan driving circuit 61 is configured to generate a scan signal. The scan signal generated by scan driving circuit 61 is provided to the control terminal of the gate writing module 11 through the scan line 62. In an example, the scan line 62 may be electrically connected to any one of the first scan signal terminal, the second scan signal terminal, and the third scan signal terminal that are arranged in a same pixel driving circuit line row 101. When the pixel driving circuit 1 is provided with more than one gate writing module 11, more than one scan line 62 electrically connected to a same pixel driving circuit line row 101 can be correspondingly provided according to an embodiment of the present disclosure, so that different scan lines 62 can transmit various scan signals required for the pixel driving circuit during operation.

The control driving circuit 21 is electrically connected to the control signal line 22, and the control terminal of the control module 12 in the pixel driving circuit 1 is electrically connected to the control signal line 22. The control driving circuit 21 is configured to generate a control signal. The control signal generated by the control driving circuit 21 is provided to the control terminal of the control module 12 through the control signal line 22.

The light-emitting driving circuit 31 is electrically connected to the light-emitting control line 32, and the control terminal of the light-emitting control module in the pixel driving circuit 1 is electrically connected to the light-emitting control line 32. The light-emitting driving circuit 31 is configured to generate a light-emitting control signal. The light-emitting control signal generated by the light-emitting driving circuit 31 is provided to the control terminal of the light-emitting control module through the light-emitting control line 32.

The data driving circuit 41 is electrically connected to the data line 42, and the first electrode of the data writing module 111 in the pixel driving circuit 1 is electrically connected to the data line 42. The data driving circuit 41 is configured to generate a data signal according to an image to be displayed. The data signal generated by the data driving circuit 41 is provided to the data writing module 111 through the data line 42.

In an example, when the display panel is operating, the scan driving circuit 61 provides a scan signal to the scan line 62 successively, and the light-emitting driving circuit 31 provides a light-emitting control signal to the light-emitting control line 32 successively. The light-emitting driving circuit 31 provides a light-emitting control signal to the light-emitting control line 32. Under an action of each signal, each pixel driving circuit 1 in the display panel works. In the embodiments of the present disclosure, the pixel driving circuits arranged at different positions of the display panel can determine the operating mode according to data of an image to be displayed, and the scan driving circuit 61 and the control driving circuit 21 can respectively provide the pixel driving circuit with a scan signal and a control signal matching the operating mode according to the image data to be displayed.

For example, the image to be displayed includes a first image to be displayed, the first image to be displayed includes a first image and a second image, and the second image is at least partially surrounded by the first image. In this case, the display panel has a first operating state corresponding to the first image corresponding to be displayed. In combination with FIG. 16, which is a schematic partition diagram of a display panel in a first operating state according to an embodiment of the present disclosure, the display panel has a display area AA, which includes a first area AA1 and a second area AA2 arranged along the second direction h2. The second area AA2 includes a first sub-area AA21 and a second sub-area AA22 arranged along the first direction h1. The first area AA1 and the first sub-area AA21 are jointly used to display the first image. The second sub-area AA22 is used to display the second image. In an example, the first image may include a static image such as a text and a picture, and the second image may include a dynamic image such as a video.

In the embodiments of the present disclosure, in the first operating state corresponding to the first image to be displayed, the pixel driving circuit 1 arranged in the first area AA1 may be in the second sub-mode, the pixel driving circuit 1 arranged in the first sub-area AA21 may be in the first sub-mode, and the pixel driving circuit 1 arranged in the second sub-area AA22 may be in the first mode. That is, the first area AA1 is a low-frequency scan area in the first operating state corresponding to the first image to be displayed, and the second area AA2 is a high-frequency scan area in the first operating state. A frequency of the signal transmitted by the scan line 62 in the low-frequency scan area is lower than a frequency of the signal transmitted by the scan line 62 in the high-frequency scan area.

According to the display panel provided by the embodiments of the present disclosure, the operating mode of the pixel driving circuit at each position of the display panel can be determined according to data of the image to be displayed. When the image to be displayed includes the first image to be displayed, in the embodiments of the present disclosure, the pixel driving circuit 1 in the first area AA1 may be in the second sub-mode, the pixel driving circuit 1 in the first sub-area AA21 may be in the first sub-mode, and the pixel driving circuit 1 in the second sub-area AA22 may be in the first mode. That is, the pixel driving circuits arranged at different positions of the display panel can select different operating modes according to the data of the image to be displayed, thereby being beneficial to reduce the power consumption of the display panel while achieving a good presentation of the image that is displayed.

In addition, when the display panel displays the first image to be displayed, in the embodiments of the present disclosure, the number of times of inputting the functional signal to the gate electrode of the driving transistor T1 of the pixel driving circuit 1 in the first sub-area AA21 can be reduced, and a bias state of the driving transistor T1 of the pixel driving circuit 1 in the first sub-area AA21 tends to be the same as a bias state of the driving transistor T1 of the pixel driving circuit 1 in the first area AA1; and when the first sub-area AA21 and the first area AA1 are jointly used to display the first image, a visible boundary line at the junction of the two can be avoided, thereby improving the display effect of the display panel.

It should be noted that the positions of the scan driving circuit 61, the control driving circuit 21, the light-emitting driving circuit 31, and the data driving circuit 41 shown in FIG. 61 are merely illustrative. In the embodiments of the present disclosure, the positions of the scan driving circuit 61, the control driving circuit 21, the light-emitting driving circuit 31 and the data driving circuit 41 can be adjusted according to different requirements. The embodiments of the present disclosure do not limit the positions of the scan driving circuit 61, the control driving circuit 21, the light-emitting driving circuit 31, and the data driving circuit 41 in the display panel. For example, in an embodiment of the present disclosure, along the second direction h2, the data driving circuit 41 and the control driving circuit 21 may be arranged at a same side of the display area AA; and along the first direction h1, the light-emitting driving circuit 31 and the scan driving circuit 61 may be arranged at a same side of the display area AA.

Figure 16:
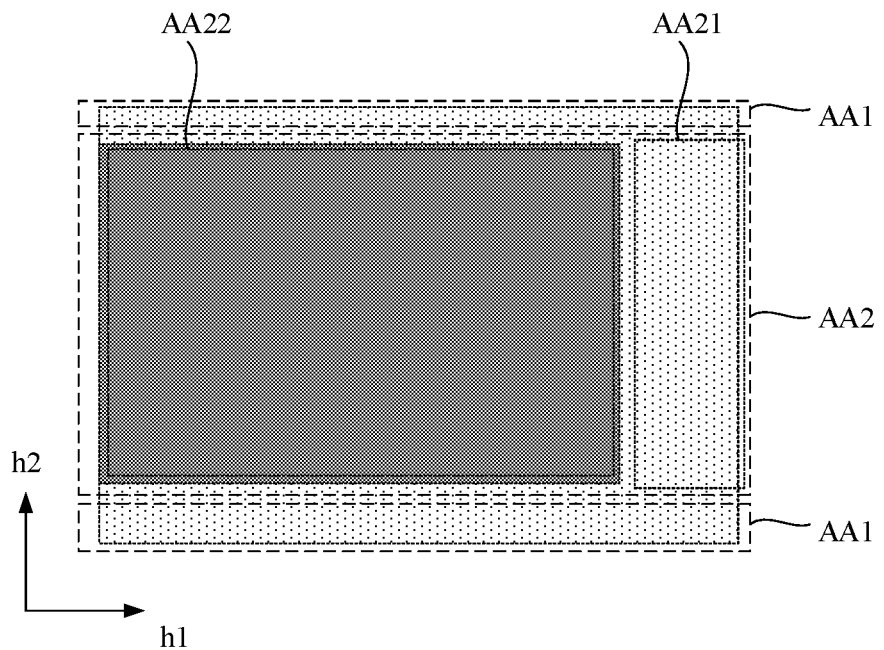
FIG. 16 is a schematic diagram of area partitions of a display panel in a first operating state according to an embodiment of the present disclosure.
Figure 17:
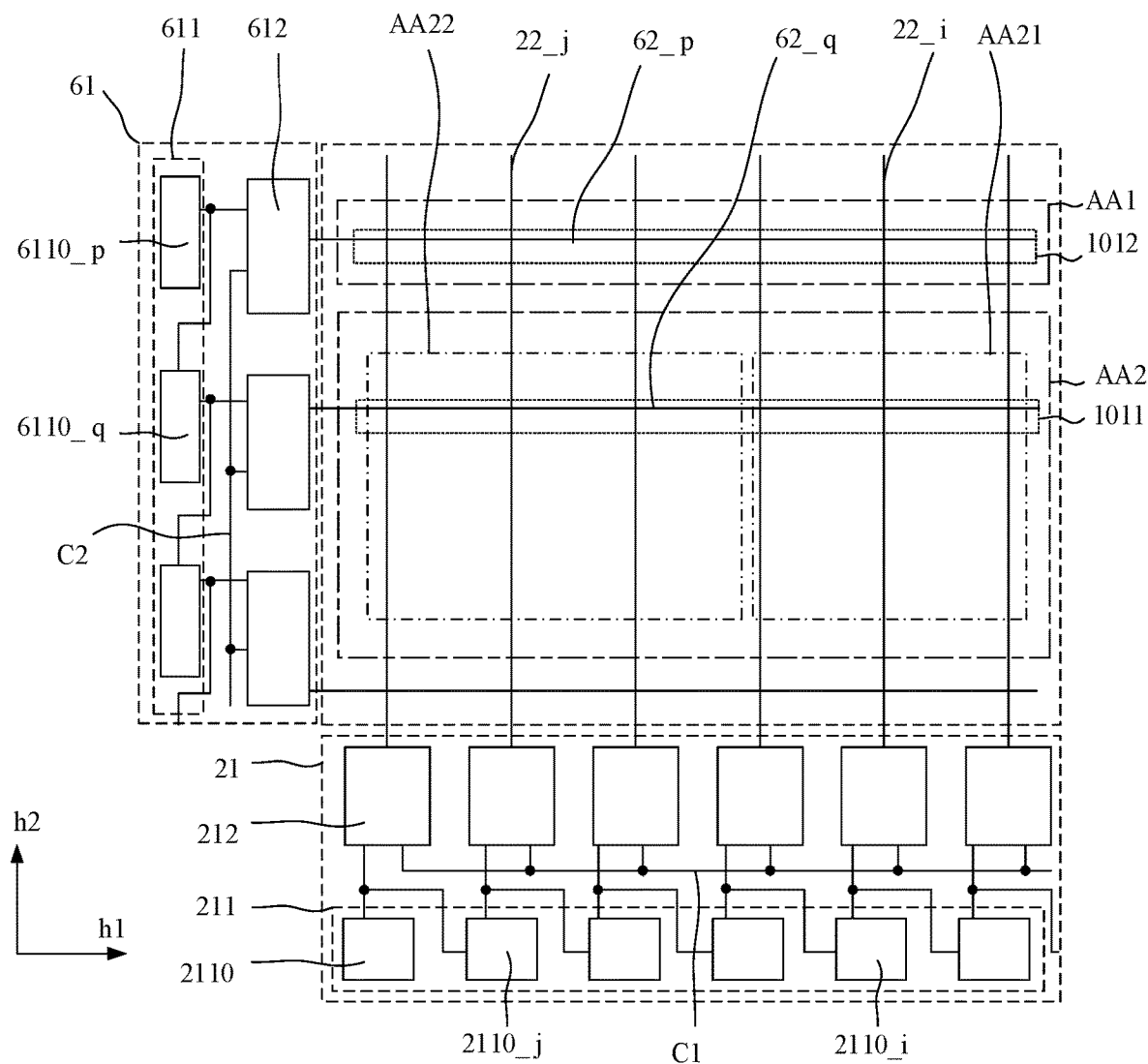
FIG. 17 is a schematic diagram of another display panel according to an embodiment of the present disclosure.

When the display panel is in the first operating state corresponding to the first image to be displayed, as shown in FIG. 16 and FIG. 17, which is a schematic diagram of another display panel according to an embodiment of the present disclosure, the scan lines at least include a $p^{th}$ scan line 62_p that passes through the first area AA1 and a $q^{th}$ scan line 62_q that passes through the second area AA2, and a frequency of the scan signal output by the $q^{th}$ scan line 62_q is greater than a frequency of the scan signal output by the $p^{th}$ scan line 62_p. The control signal lines at least include an $i^{th}$ control signal line 22_i that passes through the first sub-area AA21 and a j$^{th}$ control signal line 22_j that passes through the second sub-area AA22.

Figure 18:
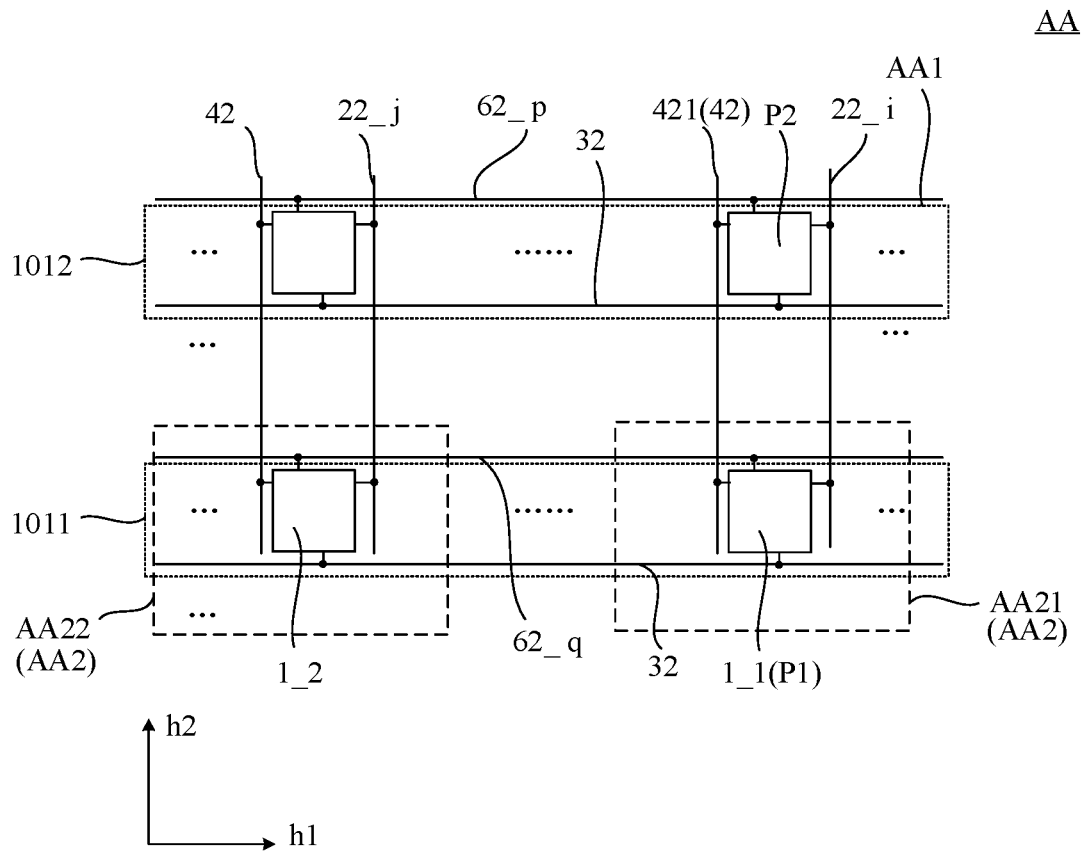
FIG. 18 is a simplified schematic diagram of a display area of a display panel according to an embodiment of the present disclosure.

In the first operating state, the second area AA2 is at least provided with a first pixel driving circuit row 1011, and the first area AA1 is at least provided with a second pixel driving circuit row 1012. The first pixel driving circuit row 1011 is electrically connected to the q$^{th}$ scan line 62_q, and the second pixel driving circuit row 1012 is electrically connected to the p$^{th}$ scan line 62_p. Each row of the first pixel driving circuit row 1011 and the second pixel driving circuit row 1012 includes pixel driving circuits arranged along the first direction h1. As shown in FIG. 18, which is a simplified schematic diagram of a display area AA of a display panel according to an embodiment of the present disclosure, the first pixel driving circuit row 1011 at least includes a first-type pixel driving circuit 1_1 and a second-type pixel driving circuit 1_2. The first-type pixel driving circuit 1_1 is arranged in the first sub-area AA21, and the first-type pixel driving circuit 1_1 is electrically connected to the i$^{th}$ control signal line 22_i. The second-type pixel driving circuit 1_2 is arranged in the second sub-area AA22, and the second-type pixel driving circuit 1_2 is electrically connected to the j$^{th}$ control signal line 22_j.

In the first operating state, during the scan time corresponding to the second area AA2, the control driving circuit 21 at least provides a non-enable signal to the first-type pixel driving circuit 1_1 in the first pixel driving circuit row 1011 through the i$^{th}$ control signal line 22_i. The scan time corresponding to the second area AA2 refers to the time during which the scan line 62 in the second area AA2 provides an enable level to turn on the corresponding gate writing module 11 in the corresponding pixel driving circuit 1. Herein, 1≤i≤n, where n denotes the number of control signal lines 22 in the display panel, and both i and n are integers.

With such a configuration, in the first operating state corresponding to the first image to be displayed, the number of times of inputting a function signal to the gate electrode of the driving transistor of the first-type pixel driving circuit 1_1 in the first sub-area AA21 can be reduced, so that the number of times of inputting a function signal to the gate electrode of the driving transistor of the first-type pixel driving circuit 1_1 in the first sub-area AA21 tends to be consistent with the number of times of inputting a function signal to the gate electrode of the driving transistor of the pixel driving circuit in the first area AA1, thereby being beneficial to improve the consistency of the bias states of the driving transistor of the pixel driving circuit in the first sub-area AA21 and in the first area AA1. Therefore, when a continuous image is displayed between the first sub-area AA21 and the first area AA1, a visible boundary line at the junction of the first sub-area AA21 and the first area AA1 can be avoided, thereby being beneficial to improve the display effect.

It should be noted that, according to different images to be displayed, the display panel may have multiple operating states. For example, when the image to be displayed includes a second image to be displayed different from the first image to be displayed, and the second image to be displayed includes a dynamic video image covering the entire display area AA, the operating states of the display panel further includes a second operating state corresponding to the second image to be displayed. In the second operating state, a scan frequency of the first area AA1 can be the same as a scan frequency of the second area AA2, and the pixel driving circuit in each of the first area AA1 and the second area AA2 can work in the first mode.

In another example, when the second image to be displayed includes a static image covering the entire display area AA, in the second operating state, a scan frequency of the first area AA1 can be the same as a scan frequency of the second area AA2, and the pixel driving circuit in each of the first area AA1 and the second area AA2 can work in the second sub-mode.

In another example, when the image to be displayed includes a third image to be displayed different from the first image to be displayed and the second image to be displayed, and the third image to be displayed includes a static image and a dynamic image at least partially surrounding the static image, the first area and the first sub-area can be used to display a dynamic image and the second sub-area can be used to display a static image. The operating states of the display panel further include a third operating state corresponding to the third image to be displayed. In the third operating state, a scan frequency of the first area AA1 can be greater than a scan frequency of the second area AA2, the pixel driving circuit in each of the first area AA1 and the first sub-area AA21 can work in the first mode, and the pixel driving circuit in the second sub-area AA22 can work in the first sub-mode.

It should be noted that the position and the area of each of the first area AA1 and the second area AA2 shown in FIG. 16 and FIG. 17 in the display panel are merely illustrative, and the position and the area of each of the first area AA1 and the second area AA2 may change as the image to be displayed changes.

In an example, the number of pixel driving circuits in the first pixel driving circuit row 1011 can be the same as the number of control signal line 22, and the pixel driving circuits in the first pixel driving circuit row 1011 can be electrically connected to the control signal lines 22 in one-to-one correspondence.

In another example, the number of pixel driving circuits in the first pixel driving circuit row 1011 may be greater than the number of control signal lines, and one control signal line 22 that passes through the first sub-area AA21 may be electrically connected to more than one pixel driving circuit of one pixel driving circuit row in the first sub-area AA21, and/or, one control signal line 22 that passes through the second sub-area AA22 may be connected to more than one pixel driving circuit in one pixel driving circuit row in the second sub-area AA22.

Figure 19:
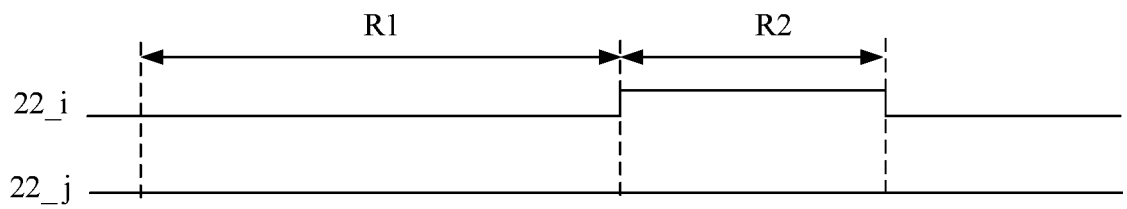
FIG. 19 is an operating time-sequence diagram of an $i^{th}$ control signal line and a $j^{th}$ control signal line according to an embodiment of the present disclosure.

In an example, in the first operating state, as shown in FIG. 19, which is an operating time-sequence diagram of an i$^{th}$ control signal line and a i$^{th}$ control signal line according to an embodiment of the present disclosure, during the scan time R1 corresponding to the area AA1, each of an i$^{th}$ control signal line 22_i and a j$^{th}$ control signal line 22_j provides an enable signal to the second pixel driving circuit row 1012; and during the scan time R2 corresponding to the second area AA2, the i$^{th}$ control signal line 22_i provides a non-enable signal to the first-type pixel driving circuit 1_1 in the first pixel driving circuit row 1011, and the j$^{th}$ control signal line 22_j provides an enable signal to the second-type pixel driving circuit 1_2 in the first pixel driving circuit row 1011.

In an example, as shown in FIG. 17, the control driving circuit 21 includes a first shift driving module 211 and first logic circuits 212. The first shift driving module 211 includes first shift units 2110 that are cascaded. A first input terminal of a first logic circuit 212 is electrically connected to an output terminal of a corresponding first shift unit 2110, a second input terminal of the first logic circuit 212 is electrically connected to a first regulating signal line C1, and an output terminal of the first logic circuit 212 is electrically connected to the control signal line 22 in one-to-one correspondence. At least an $i^{th}$ first shift unit 2110_$i$ of the first shift units 2110 is electrically connected to the $i^{th}$ control signal line 22_$i$.

In the first operating state, during the scan time R2 corresponding to the second area AA2, an signal output from the $i^{th}$ first shift unit 2110_$i$ and the signal of the first regulating signal line C1 provide a non-enable level to the $i^{th}$ control signal line 22_$i$ after the logic operation of the first logic circuit 212. Under an action of non-enable level, the control module 12 in the first-type pixel driving circuit 1_1 electrically connected to the $i^{th}$ control signal line is turned off.

In an example, in the first operating state, during the scan time R2 corresponding to the second area AA2, the control driving circuit 21 provides an enable signal to the second-type pixel driving circuit 1_2 in the first pixel driving circuit row 1011 at least through the $i^{th}$ control signal line 22_$j$. Herein, 1≤j≤n, where j is an integer, and j≠i. With such a configuration, when the first-type pixel driving circuit 1_1 and the second-type pixel driving circuit 1_2 are connected to a same scan line, the second sub-area AA22 can be used to display a second image different from that displayed by the first sub-area AA21.

As shown in FIG. 17, the first shift units 2110 that are cascaded further include a $j^{th}$ first shift unit 2110_$j$, and the $j^{th}$ first shift unit 2110_$j$ is electrically connected to the $j^{th}$ control signal line 22_$j$. During the scan time corresponding to the second area AA2, the signal output from the $j^{th}$ first shift unit 2110_$j$ and the signal of the first regulating signal line C1 provide an enable level to the $j^{th}$ control signal line 22_$j$ after the logic operation of the first logic circuit 212. Under an action of the enable level, the control module 12 in the second-type pixel driving circuit 1_2 electrically connected to the $j^{th}$ control signal line is turned on.

In an example, an enable level of the control transistor in the control module is a low level, and a non-enable level of the control transistor in the control module is a high level. For example, when the control module includes a P-type transistor, the first logic circuit 212 may perform an NOR operation on the signals at the first input terminal and the second input terminal; during the scan time corresponding to the first area AA1, the first regulating signal line C1 may provide a high level; and during the scan time corresponding to the second area AA2, the first regulating signal line C1 may provide a low level, the output terminal of the $i^{th}$ first shift unit 2110_$i$ may output a low level, and the output terminal of the $j^{th}$ first shift unit 2110_$j$ may output a high level.

In another example, in an embodiment of the present disclosure, the enable level of the control transistor in the control module is a low level, and the non-enable level of the control transistor in the control module is a high level. For example, in the embodiments of the present disclosure, the control module may include an N-type transistor. In this case, the first logic circuit 212 performs a NAND operation on the signals at the first input terminal and the second input terminal. During the scan time corresponding to the first area AA1, the first regulating signal line C1 may provide a low level. During the scan time corresponding to the second area AA2, the first regulating signal line C1 may provide a high level, the output terminal of the $i^{th}$ first shift unit 2110_$i$ may output a high level, and the output terminal of the $j^{th}$ shift unit 2110_$j$ may output a low level.

Figure 20:
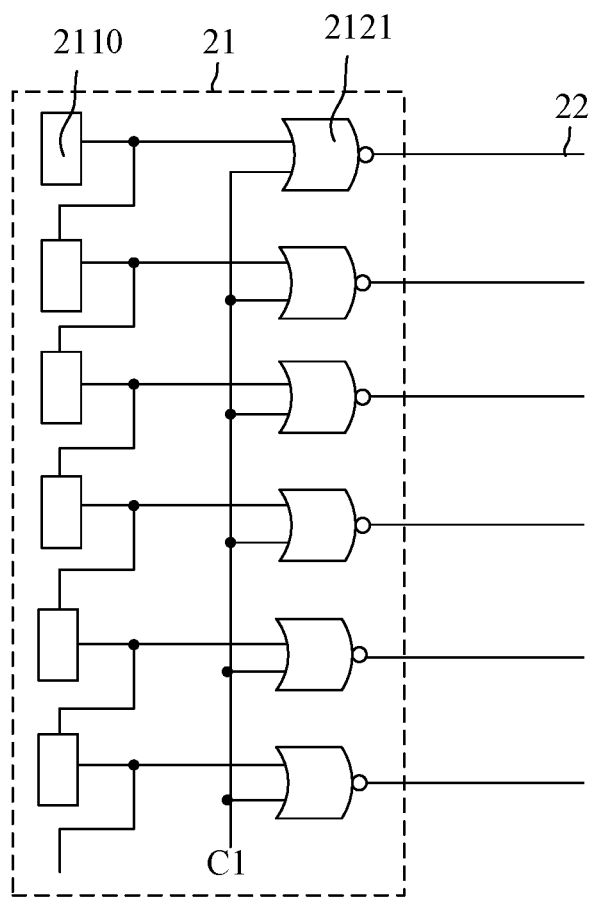
FIG. 20 is a schematic diagram of a control driving circuit according to an embodiment of the present disclosure.

In an example, when the first logic circuit 212 performs an NOR operation on the signals at the first input terminal and the second input terminal, as shown in FIG. 20, which is schematic diagram of a control driving circuit according to an embodiment of the present disclosure, the first logic circuit 212 may include an NOR gate 2121. A first input terminal of the NOR gate 2121 is electrically connected to the output terminal of a corresponding first shift unit 2110. A second input terminal of the NOR gate 2121 is electrically connected to the first regulating signal line C1. An output terminal of the NOR gate 2121 is electrically connected to the control signal line 22 in one-to-one correspondence.

Figure 21:
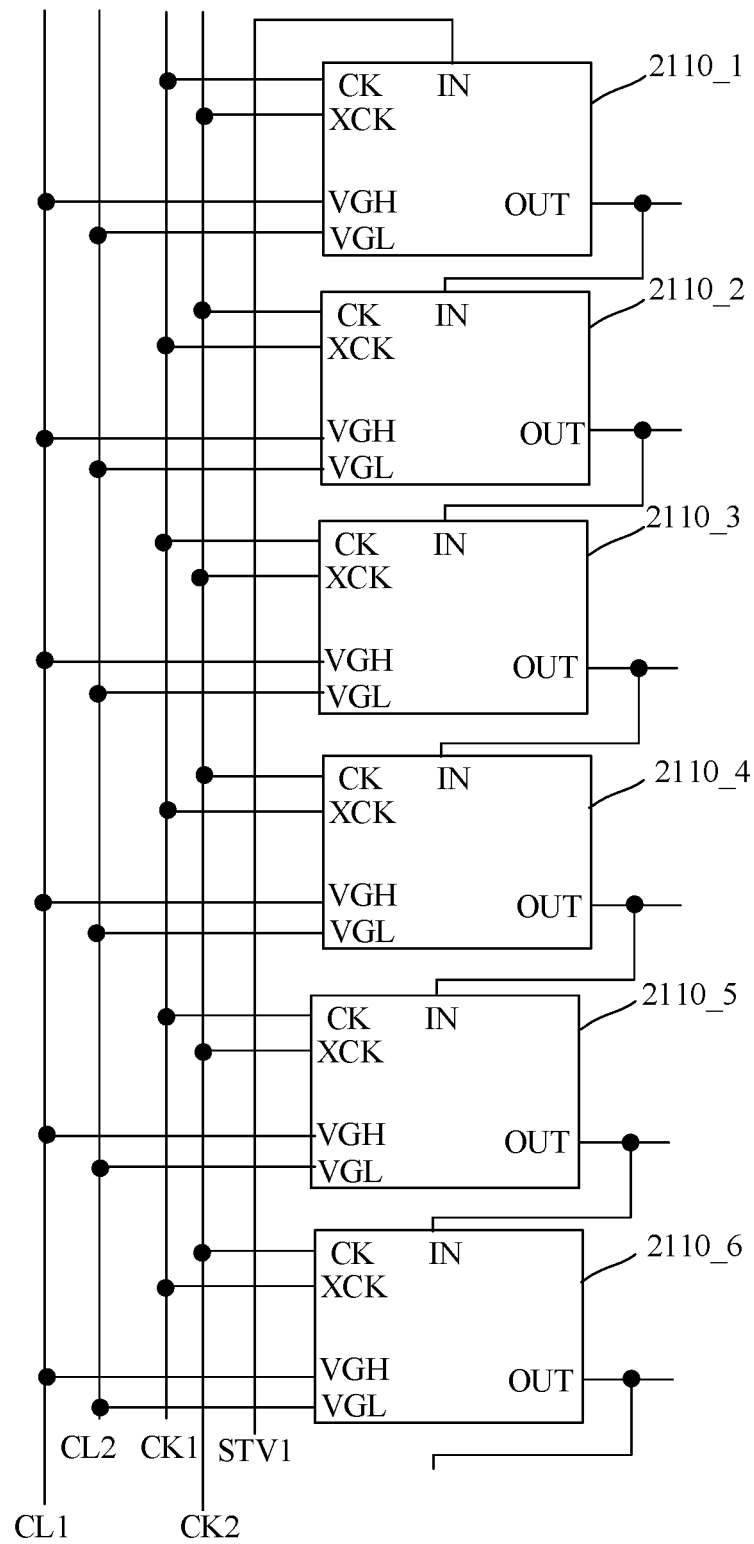
FIG. 21 is a schematic diagram of a first shift driving module according to an embodiment of the present disclosure.

In an example, as shown in FIG. 21, which is a schematic diagram of a first shift driving module according to an embodiment of the present disclosure, the first shift driving module includes first shift units that are cascaded. FIG. 21 merely shows an example that the $1^{st}$ first shift unit 2110_1 to the $6^{th}$ first shift unit 2110_6. Each first shift unit includes a first clock signal terminal CK, a second clock signal terminal XCK, a first level signal terminal VGH, a second level signal terminal VGL and an output terminal OUT. The display panel may further include a start signal line STV1, a first clock line CK1, a second clock line CK2, a first level line CL1 and a second level line CL2. The start signal line STV1 is electrically connected to the input terminal IN of the $1^{st}$ first shift unit 2110_1. The input terminal IN of any other first shift unit 2110_1 is electrically connected to the output terminal OUT of a previous first shift unit 2110_1. The first clock line CK1 is electrically connected to the first clock signal terminal CK of a first shift unit 2110 of odd-numbered stage and is electrically connected to the second clock signal terminal XCK of a first shift unit 2110 of even-numbered stage. The second clock line CK2 is electrically connected to the second clock signal terminal XCK of a first shift unit 2110 of odd-numbered stage and is electrically connected to the first clock signal terminal CK of a first shift unit 2110 of even-numbered stage. The first level line CL1 is electrically connected to the first level signal terminal VGH of the first shift unit 2110, and the second level line CL2 is electrically connected to the second level signal terminal VGL of the first shift unit 2110.

Figure 22:
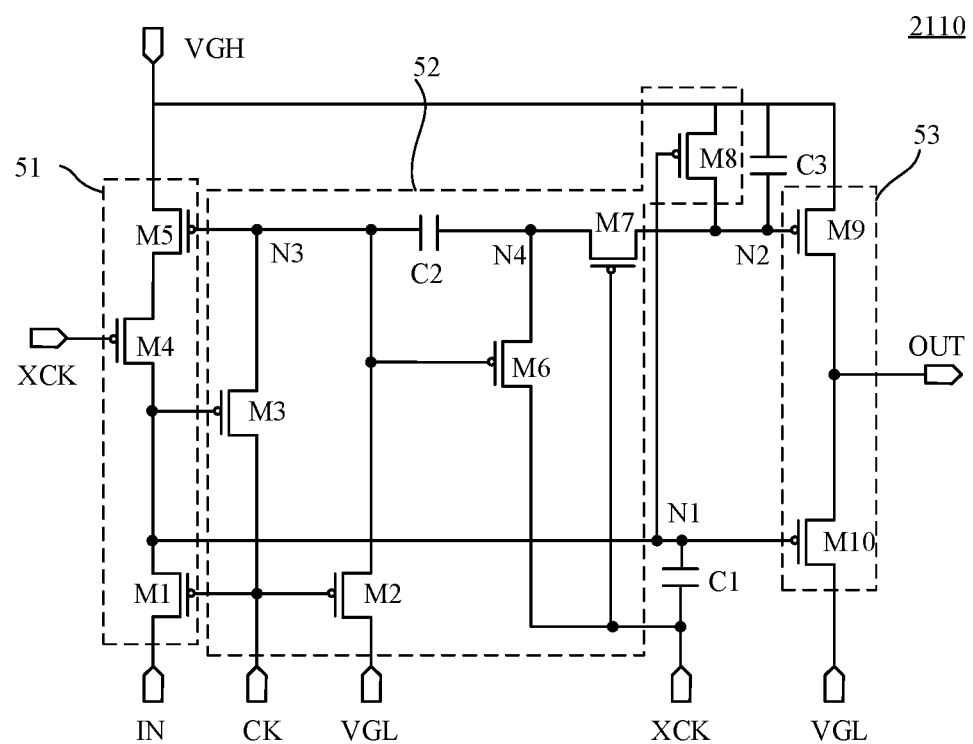
FIG. 22 is a schematic diagram of a first shift unit according to an embodiment of the present disclosure.

FIG. 22 is a schematic diagram of a first shift unit 2110 according to an embodiment of the present disclosure. As shown in FIG. 22, the first shift unit 2110 includes a first processing unit 51, a second processing unit 52 and an output unit 53. The first processing unit 51 provides a signal at the input terminal IN to a first node N1 in response to a signal at the first clock signal terminal CK, and the first processing unit 51 provides a signal at the first level signal terminal VGH to the first node N1 in response to signals at the second clock signal terminal XCK and the third node N3. The second processing unit 52 provides a signal at the second level signal terminal VGL to a third node N3 in response to a signal at the first clock signal terminal CK, the second processing unit 52 provides a signal at the first clock signal terminal CK to the third node N3 in response to a signal at the first node N1, the second processing unit 52 provides a signal at the second clock signal terminal XCK to a fourth node N4 in response to a signal at the third node N3, and the second processing unit 52 provides the signal at the fourth node N4 to a second node N2 in response to the signal at the second clock signal terminal XCK. The output unit 53 provides the signal at the second level signal terminal VGL to the output terminal OUT in response to the signal at the first node N1, and the output unit 53 provides the signal at the first level signal terminal VGH to the output OUT in response to the signal at the second node N2.

In an example, as shown in FIG. 22, the first processing unit 51 includes a first transistor M1, a fourth transistor M4 and a fifth transistor M5. The second processing unit 52 includes a second transistor M2, a third transistor M3, a sixth transistor M6, a seventh transistor M7 and an eighth transistor M8. The output unit 53 includes a ninth transistor M9 and a tenth transistor M10. In an embodiment, as shown in FIG. 22, the first shift unit 2110 further includes a first capacitor C1, a second capacitor C2 and a third capacitor C3.

Figures 23, 24:
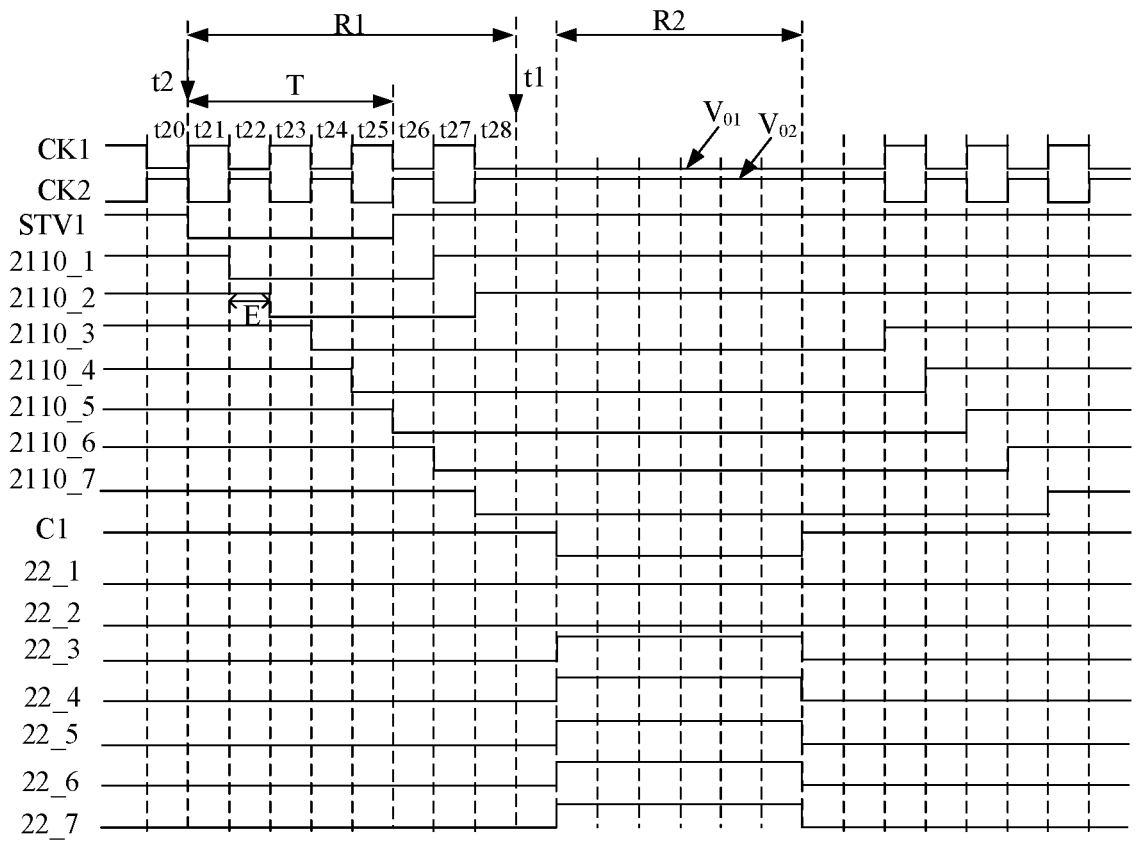
FIG. 23 is an operating time-sequence diagram of the control drive circuit shown in FIG. 20.
FIG. 24 is a schematic diagram of a driving method for a display panel according to an embodiment of the present disclosure.

FIG. 23 is an operating time-sequence diagram of the control drive circuit shown in FIG. 20. In an example, as shown in FIG. 23, the first control signal line 22_1 to the sixth control signal line 22_6 are illustrated, the 1$^{st}$ first shift unit 2110_1 to the 6$^{th}$ first shift unit 2110_6 are electrically connected to the first control signal line 22_1 to the sixth control signal line 22_6 in one-to-one correspondence. Each of the first clock line CK1 and the second clock line CK2 is configured to provide a suspension signal at least during the scan time R2 corresponding to the second area AA2. For example, as shown in FIG. 23, a potential of the suspension signal provided by the first clock line CK1 is V01, and a potential of the suspension signal provided by the second clock line CK2 is V02. Under an action of the suspension signal, the output terminal of the i$^{th}$ first shift unit 2110_i and the output terminal of the j$^{th}$ first shift unit 2110_j output different levels, so as to provide a non-enable level to the i$^{th}$ control signal line 22_i and provide an enable level to the j$^{th}$ control signal line 22_j. In FIG. 23, i may be 3, 4, 5, 6, or 7; and j may be 1 or 2.

As shown in FIG. 23, during the scan time R1 corresponding to the first area AA1, the first clock line CK1 and the second clock line CK2 provide pulse signals, and under an action of the pulse signals, each first shift unit 2110 shifts and outputs the pulse signal provided by the start signal line STV1 step by step; and during the scan time R1 corresponding to the first area AA1, the first regulating signal line C1 provides a high level, and the high level provided by the first regulating signal line C1 and the signal of each first shift unit 2110 each output an enable level (low level) after the NOR operation of the first logic circuit 212 shown in FIG. 1. That is, according to the embodiments of the present disclosure, in the first operating state, during the scan time R1 corresponding to the first area AA1, the control driving circuit provides an enable level to each of the i$^{th}$ control signal line 22_i and the j$^{th}$ control signal line 22_j, so that during the scan time R1 corresponding to the first area AA1, in the first area AA1, each of the control module in the pixel driving circuit electrically connected to the i$^{th}$ control signal line 22_i and the control module in the pixel driving circuit electrically connected to the j$^{th}$ control signal line 22_j can be turned on.

In an example, as shown in FIG. 23, in an embodiment of the present disclosure, a continuous duration of an enable signal transmitted by the start signal line STV1 is T, and a shift duration of two adjacent first shift units 2110 is E. During the scan time R2 corresponding to the second area AA2, the number of the first-type pixel driving circuits in the first pixel driving circuit row 1011 is M, where T=E*M.

In an example, in the first operating state, during the scan time R2 corresponding to the second area AA2, the M control signal lines 22 that provide enable signals to the M first-type pixel driving circuits are electrically connected to an a$^{th}$ first shift unit 2110_a to a (a+M−1)$^{th}$ first shift unit 2110_(a+M−1) in one-to-one correspondence; the start moment of the suspension signal is t1, and the start moment of the enable signal transmitted by the start signal line STV1 is t2, where t1=t2+T+a*E.

In the embodiments of the present disclosure, the continuous duration of the suspension signal is related to the scan time R2 corresponding to the second area AA2 in the first operating state. When a length of the second area AA2 in the second direction h2 is relatively large and the second area AA2 is provided with a large number of first pixel driving circuit rows 1011, the continuous duration of the suspension signal can be relatively long. When the length of the second area AA2 in the second direction h2 is relatively small and the second area AA2 is provided with a small number of first pixel driving circuit rows 1011, the continuous duration of the suspension signal can be relatively short.

The operating process of the control driving circuit will be described below in combination with FIG. 21, FIG. 22 and FIG. 23.

During the scan time R1 corresponding to the first area AA1, the first clock line CK1 and the second clock line CK2 provide pulse signals. In an example, as shown in FIG. 23, the periods of the two are both 2E. Under an action of the pulse signals, each first shift unit 2110 shifts and outputs the pulse signal provided by the start signal line STV1 step by step.

Taking the 1$^{st}$ first shift unit 2110_1 as an example, as shown in FIG. 22 and FIG. 23, in an initial sub-period t20, the first clock signal terminal CK of the 1$^{st}$ first shift unit 2110_1 receives a low level through the first clock line CK1, the first transistor M1 and the second transistor M2 are turned on. A high-level signal provided by the start signal line STV1 received by the input terminal IN makes the first node N1 high through the first transistor M1, and the third transistor M3, the eighth transistor M8 and the tenth transistor M10 are turned off. A low-level signal provided by the first level signal terminal VGL makes the third node N3 low through the second transistor M2, and the fifth transistor M5 and the sixth transistor M6 are turned on. The second clock signal terminal XCK receives a high level through the second clock line CK2, and the high-level signal makes the fourth node N4 high through the sixth transistor M6. Under control of the second clock signal terminal XCK, the seventh transistor M7 is turned off, and the output terminal OUT of the 1$^{st}$ first shift unit 2110_1 maintains a high level in an initial state.

In a first sub-period t21, the first clock signal terminal CK of the 1$^{st}$ first shift unit 2110_1 receives a high level, the first transistor M1 and the second transistor M2 are turned off, the first node N1 maintains at the high level in the initial sub-period t20, and the third transistor M3, the eighth transistor M8 and the tenth transistor M10 are turned off. The third node N3 maintains at the low level in the initial sub-period t20, and the fifth transistor M5 and the sixth transistor M6 are turned on. The second clock signal terminal XCK receives a low level, and the fourth transistor M4 and the seventh transistor M7 are turned on. A high level received by the second level signal terminal VGH makes the first node N1 high through the fifth transistor M5 and the fourth transistor M4. A low level received by the second clock signal terminal XCK makes the fourth node N4 low through the sixth transistor M6, and the low level makes the second node N2 low through the seventh transistor M7, the ninth transistor M9 is turned on, and a high level received by the second level signal terminal VGH makes the output terminal OUT of the 1$^{st}$ first shift unit 2110_1 high through the ninth transistor M9.

In a second sub-period t22, the first clock signal terminal CK receives a low level, the first transistor M1 and the second transistor M2 are turned on, a low level signal provided by the start signal line STV1 and received by the input terminal IN makes the first node N1 low through the first transistor M1, and the third transistor M3, the eighth transistor M8, and the tenth transistor M10 are turned on.

The third transistor M3 inputs the low level signal received by the first clock signal terminal CK to the third node N3, the second transistor M2 inputs the low level signal received by the first level signal terminal VGL to the third node N3, the fifth transistor M5 and the sixth transistor M6 are turned on, and the sixth transistor M6 inputs the high level received by the second clock signal terminal XCK to the fourth node N4. The eighth transistor M8 inputs the high level received by the second level signal terminal VGH to the second node N2. The tenth transistor M10 inputs the low level received by the first level signal terminal VGL into the output terminal OUT.

In a third sub-period t23, the first clock signal terminal CK receives a high level, the first transistor M1 and the second transistor M2 are turned off, the first node N1 maintains at the low level in the second sub-period t22, and the third transistor M3, the eighth transistor M8 and the tenth transistor M10 are turned on. The eighth transistor M8 inputs the high level received by the second level signal terminal VGH to the second node N2, and the second clock signal terminal XCK receives a low level, so that the fourth transistor M4 and the seventh transistor M7 are turned on. The seventh transistor M7 provides the high level at the fourth node N4 to the second node N2, and the ninth transistor M9 is turned off. Moreover, since a potential at the second clock signal terminal XCK jumps to a low level, a coupling effect by the first capacitor C1 can make the potential at the first node N1 even lower, so that the tenth transistor M10 can input the low-level signal provided by the first level signal terminal VGL to the output terminal OUT without loss, thereby allowing the output terminal OUT to stably output a low level.

In a fourth sub-period t24, the first clock signal terminal CK receives a low level, the first transistor M1 and the second transistor M2 are turned on, the low-level signal received by the input terminal IN makes the first node N1 low through the first transistor M1, and the third transistor M3, the eighth transistor M8, and the tenth transistor M10 are turned on. The third transistor M3 inputs the low level received by the first clock signal terminal CK to the third node N3. The second transistor M2 inputs the low level received by the first level signal terminal VGL to the third node N3. The fifth transistor M5 and the sixth transistor M6 are turned on. The sixth transistor M6 inputs the high level received by the second clock signal terminal XCK to the fourth node N4. The eighth transistor M8 inputs the high level received by the second level signal terminal VGH to the second node N2. The tenth transistor M10 inputs the low level received by the first level signal terminal VGL to the output terminal OUT.

In a fifth sub-period t25, the first clock signal terminal CK receives a high level, the first transistor M1 and the second transistor M2 are turned off, the first node N1 maintains at the low level in the fourth sub-period t24, and the third transistor M3, the eighth transistor M8 and the tenth transistor M10 are turned on. The third transistor M3 inputs the high level received by the first clock signal terminal CK to the third node N3. The fifth transistor M5 and the sixth transistor M6 are turned off. The fourth node N4 maintains at the high level in the fourth sub-period t24. The eighth transistor M8 inputs the high level received by the second level signal terminal VGH to the second node N2. The second clock signal terminal XCK receives a low level. The fourth transistor M4 and the seventh transistor M7 are turned on. The seventh transistor M7 provides the high level at the fourth node N4 to the second node N2. The ninth transistor M9 is turned off. Moreover, since a potential at the second clock signal terminal XCK jumps to a low level, a coupling effect by the first capacitor C1 can make the potential at the first node N1 even lower, so that the tenth transistor M10 can input the low level provided by the first level signal terminal VGL to the output terminal OUT without loss, thereby allowing the output terminal OUT to stably output a low level.

In a sixth sub-period t26, the first clock signal terminal CK receives a low level, the first transistor M1 and the second transistor M2 are turned on, the first transistor M1 inputs the high level provided by the input terminal IN to the first node N1, and the third transistor M3, the eighth transistor M8 and the tenth transistor M10 are turned off. The second transistor M2 inputs the low level provided by the first level signal terminal VGL to the third node N3. The fifth transistor M5 and the sixth transistor M6 are turned on. The sixth transistor M6 inputs the high level received by the second clock signal terminal XCK to the fourth node N4. The second clock signal terminal XCK receives a high level. The seventh transistor M7 is turned off. The second node N2 maintains at the high level in the fifth sub-period t25. The ninth transistor M9 is turned off. The output terminal OUT maintains a low level in the fifth sub-period t25.

In a seventh sub-period t27, the first clock signal terminal CK receives a high level, the first transistor M1 and the second transistor M2 are turned off, the first node N1 maintains at the high level in the sixth sub-period t26, and the third transistor M3, the eighth transistor M8 and the tenth transistor M10 are turned off. The third node N3 maintains at the low level in the sixth sub-period t26. The fifth transistor M5 and the sixth transistor M6 are turned on. Under an action of the low level received by the second clock signal terminal XCK, the fourth transistor M4 and the seventh transistor M7 are turned on. The low level received by the second clock signal terminal XCK is input to the fourth node N4 through the sixth transistor M6. The low level at the fourth node N4 is input to the second node N2 through the seventh transistor M7. The ninth transistor M9 is turned on. The second level signal terminal VGH makes the output terminal OUT output a high level through the ninth transistor M9.

In an eighth sub-period t28, the first clock signal terminal CK receives a low level, the first transistor M1 and the second transistor M2 are turned on, the first transistor M1 inputs the high level received by the input terminal IN to the first node N1, and the third transistor M3, the eighth transistor M8 and the tenth transistor M10 are turned off. The second transistor M2 inputs the low level received by the first level signal terminal VGL to the third node N3. The fifth transistor M5 and the sixth transistor M6 are turned on. The sixth transistor M6 inputs the high level received by the second clock signal terminal XCK to the fourth node N4. The second clock signal terminal XCK receives a high level. The seventh transistor M7 is turned off. The second node N2 maintains at the low level in the seventh sub-period t27. The ninth transistor M9 is turned on. The output terminal OUT maintains at the high level in the seventh sub-period t27.

In the embodiments of the present disclosure, during the scan time R1 corresponding to the first area AA1, the first regulating signal line C1 provides a high level, and the high level provided by the first regulating signal line C1 and the signal of each first shift unit 2110 each output an enable level (low level) after the NOR operation of the first logic circuit 212 shown in FIG. 17. That is, with the configuration provided by the embodiments of the present disclosure, in the first operating state, during the scan time R1 corresponding to the first area AA1, the control driving circuit can provide an enable level to each of the first control signal line 22_1 to the seventh control signal line 22_7. Therefore, during the scan time R1 corresponding to the first area AA1, the control module in the pixel driving circuit electrically connected to each of the first control signal line 22_1 to the seventh control signal line 22_7 in the first area AA1 can be turned on.

In an example, during the scan time R2 corresponding to the second area AA2, each of the first control signal line 22_1 and the second control signal line 22_2 output an enable signal, and each of the third control signal line 22_3 to the seventh control signal line 22_7 outputs a non-enable signal. As shown in FIG. 23, each of the first clock line CK1 and the second clock line CK2 transmits a suspension signal at the start moment t1. Under an action of the suspension signal, each of the $1^{st}$ first shift unit 2110_1 and the $2^{nd}$ first shift unit 2110_2 outputs a high level, and each of the $3^{rd}$ first shift unit 2110_3 to the $7^{th}$ first shift unit 2110_7 outputs a low level. FIG. 23 shows an example that the suspension signal transmitted by the first clock line CK1 is at a constant low level, and the suspend signal transmitted by the second clock line CK2 is at a constant high level. Under an action of the suspension signal, as shown in FIG. 23, each of the outputs of the $3^{rd}$ first shift unit 2110_3 to the $7^{th}$ first shift unit 2110_7 maintains at a low level that is before the suspension signal, and each of the outputs of the $1^{st}$ first shift unit 2110_1 and the $2^{nd}$ first shift unit 2110_2 maintains at a high level that is before the suspension signal.

In addition, in the embodiments of the present disclosure, during the scan time R2 corresponding to the second area AA2, the first regulating signal line C1 provides a low level, the low level provided by the first regulating signal line C1 and the signal output from each of the $3^{rd}$ first shift unit 2110_3 to the $7^{th}$ first shift unit 2110_7 each output a non-enable level (high level) after the NOR operation of the first logic circuit 212 shown in FIG. 17, and the low level provided by the first regulating signal line C1 and the signal output from each of the $1^{st}$ first shift unit 2110_1 and the $2^{nd}$ first shift unit 2110_2 each output an enable level (low level) after the NOR operation of the first logic circuit 212 shown in FIG. 17. That is, with the configuration provided by the embodiments of the present disclosure, in the first operating state, during the scan time R2 corresponding to the second area AA2, the control driving circuit can provide a non-enable level to each of the third control signal line 22_3 to the seventh control signal line 22_7, and provide an enable level to each of the first control signal line 22_1 and the second control signal line 22_2. Therefore, during the scan time R2 corresponding to the second area AA2, the control module in the first-type pixel driving circuit electrically connected to each of the third control signal line 22_3 to the seventh control signal line 22_7 in the second area AA2 is turned off, and the control module in the second-type pixel driving circuit electrically connected to each of the first control signal line 22_1 and the second control signal line 22_2 is turned on.

In an example, as shown in FIG. 17, the scan driving circuit 61 includes a second shift driving module 611 and second logic circuits 612. The second shift driving module 611 includes second shift units 6110 that are cascaded. A first input terminal of the second logic circuit 612 is electrically connected to an output terminal of a corresponding second shift unit 6110, a second input terminal of the second logic circuit 612 is electrically connected to the second regulating signal line C2, and an output terminal of the second logic circuit 612 is electrically connected to the scan lines 62 in one-to-one correspondence.

The second shift units 6110 that are cascaded at least include a $p^{th}$ second shift unit 6110_p and a $q^{th}$ second shift unit 6110_q, and the $p^{th}$ second shift unit 6110_p is electrically connected to the $p^{th}$ scan line 62_p, and the $q^{th}$ second shift unit 6110_q is electrically connected to the $q^{th}$ scan line 62_q.

In the first operating state, the signal output from the $p^{th}$ second shift unit 6110_p and the signal of the second regulating signal line C2 provide a non-enable level to the $p^{th}$ scan line 62_p after the logic operation of the second logic circuit 612, and the signal output from the $q^{th}$ second shift unit 6110_q and the signal of the second regulating signal line C2 provide an enable level to the $q^{th}$ scan line 62_q after the logic operation of the second logic circuit 612. In an example, when the enable level corresponding to scan line 62 is a low level and the non-enable level corresponding to scan line 62 is a high level, the second logic circuit 612 may include a NOR gate.

With further reference to FIG. 18, the data lines 42 at least include a first data line 421, the first data line 421 is electrically connected to a first sub-pixel P1 and a second sub-pixel P2, and each of the first sub-pixel P1 and the second sub-pixel P2 includes a light-emitting element and the pixel driving circuit described above. The pixel driving circuit is electrically connected to the light-emitting element, and the pixel driving circuit provides a light-emitting current to the light-emitting element. In the first operating state, the first sub-pixel P1 is electrically connected to the $q^{th}$ scan line 62_q, and the second sub-pixel P2 is electrically connected to the $p^{th}$ scan line 62_p. In addition, each of the first sub-pixel P1 and the second sub-pixel P2 may be electrically connected to the $i^{th}$ control signal line 22_i. That is, the first sub-pixel P1 is a sub-pixel operating in the first sub-mode in the first operating state, and the second sub-pixel P2 is a sub-pixel operating in the second sub-mode in the first operating state. As shown in FIG. 18, in the first operating state, the first sub-pixel P1 includes the first-type pixel driving circuit 1_1 described above.

In the first operating state, the first data line 421 is configured to provide an adjustment voltage V1 to the first sub-pixel P1 in the adjustment stage. In the adjustment stage, a potential of the first electrode of the driving transistor T1 in the second sub-pixel P2 is V2, and a difference between V1 and V2 is smaller than or equal to a preset threshold. And, in the adjustment stage, the $p^{th}$ scan line 62_p provides a non-enable level and the $q^{th}$ scan line 62_q provides an enable level. That is, the adjustment stage is in the data maintaining stage of the first sub-pixel P1 and the second sub-pixel P2. In the adjustment stage, the control module 12 in the pixel driving circuit of the first sub-pixel P1 is turned off, and the potential input to the first electrode of the driving transistor T1 in the first sub-pixel P1 will not affect the potential of the gate electrode of the driving transistor T1. If the difference between V1 and V2 is smaller than or equal to the preset threshold, the driving transistor T1 of the second sub-pixel P2 operating in the second sub-mode in the first operating state and the driving transistor T1 of the first sub-pixel P1 operating in the first sub-mode in the first operating state tend to have a consistent bias state in the data maintaining stage. With this configuration, the brightness of the second sub-pixel P2 operating in the second sub-mode in the first operating state and the brightness of the first sub-pixel P1 operating in the first sub-mode in the first operating state tend to be consistent, thereby further improving the display effect of the display panel.

The embodiments of the present disclosure further provide a driving method for driving the display panel described above. A structure of the display panel 100 has been described in detail in the foregoing embodiments and will not be repeated herein. With reference to FIG. 24, which is a schematic diagram of a driving method for a display panel according to an embodiment of the present disclosure, the driving method includes the following steps.

At step S1, the control driving circuit 21 is configured to provide a non-enable signal to each of at least part of the control signal lines 22, so that the pixel driving circuit 1 connected to each of the at least part of the control signal lines 22 works in the first sub-mode described above.

Based on the driving method for the display panel according to the embodiments of the present disclosure, the operating mode of the pixel driving circuit at each position of the display panel can be determined according to data of the image to be displayed. When the image to be displayed includes the first image to be displayed, the pixel driving circuit 1 in the first area AA1 can be in the second sub-mode, the pixel driving circuit 1 in the first sub-area AA21 can be in the first sub-mode, and the pixel driving circuit 1 in the second sub-area AA22 can be in the first mode. That is, the pixel driving circuit at each of different positions of the display panel can select a different operating mode according to the data of the image to be displayed. In this way, while ensuring a good presentation of the displayed image, it is beneficial to reduce the power consumption of the display panel.

In addition, when the display panel displays the first image to be displayed, based on the configuration according to the embodiments of the present disclosure, the number of function signals input to the gate electrode of the driving transistor T1 in the pixel driving circuit 1 in the first sub-area AA21 can be reduced, and the bias state of the driving transistor T1 in the pixel driving circuit 1 in the first sub-area AA21 tends to be consistent with the bias state of the driving transistor T1 in the pixel driving circuit 1 in the first area AA1. When the first sub-area AA21 and the first area AA1 are jointly used to display the first image, a visible boundary line at the junction of the two can be avoided, thereby improving the display effect of the display panel.

Figure 25:
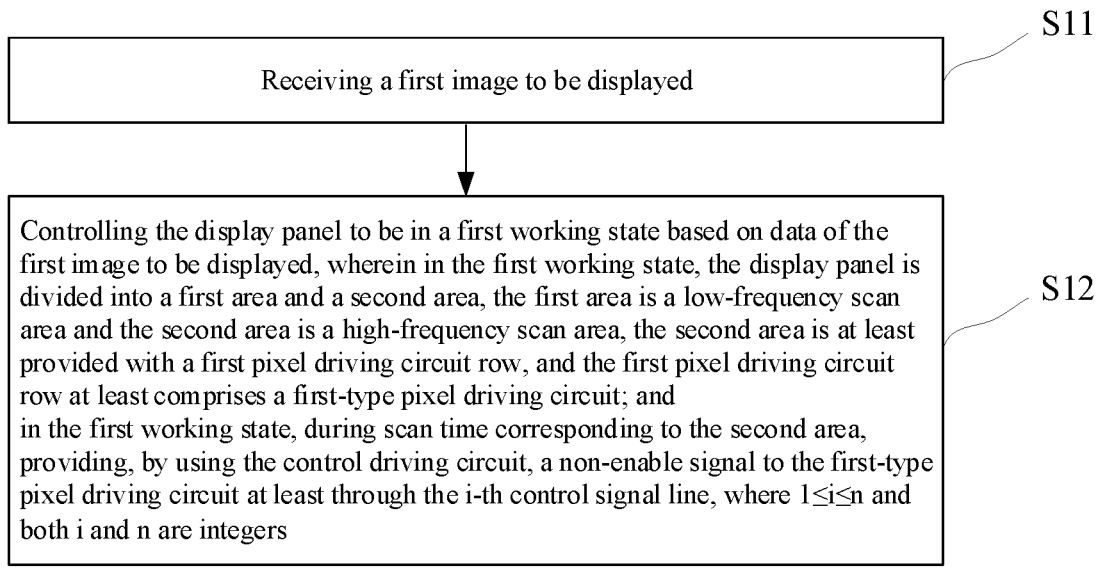
FIG. 25 is a schematic diagram of a driving method for another display panel according to an embodiment of the present disclosure.

FIG. 25 is a schematic diagram of a driving method for another display panel according to an embodiment of the present disclosure. In an example, as shown in FIG. 17 and FIG. 25, the display panel includes n control signal lines. The step of "the control driving circuit 21 being configured to provide a non-enable signal to each of at least part of the control signal lines 22" includes the following steps.

At step S11: data of the first image to be displayed is received.

At step S12, the display panel is controlled to be in the first operating state according to the data of the first image to be displayed, and in the first operating state, the display area of the display panel includes a first area AA1 and a second area AA2 arranged along a second direction h2. The second area AA2 includes a first sub-area AA21 and a second sub-area AA22 arranged along a first direction h1. The first area AA1 is a low-frequency scan area, and the second area AA2 is a high-frequency scan area. The second area AA2 is provided with a first pixel driving circuit row 1011, and the first pixel driving circuit row 1011 at least includes a first-type pixel driving circuit and a second-type pixel driving circuit. The first-type pixel driving circuit is located in the first sub-area AA21, and the second-type pixel driving circuit is located in the second sub-area AA22. The scan signal terminals of the first-type pixel driving circuit and the second-type pixel driving circuit are connected to a same scan line.

In the first operating state, during the scan time corresponding to the second area AA2, the control driving circuit 21 is configured to provide a non-enabling signal to the first-type pixel driving circuit at least through the $i^{th}$ control signal line $22\_i$. Herein, $1 \le i \le n$, where i and n are both integers.

In an example, in the first operating state, the first pixel driving circuit row 1011 further at least includes a second-type pixel driving circuit, and the driving method further includes the following step. The control driving circuit 21 is configured to provide an enable signal to the second-type pixel driving circuit at least through the $j^{th}$ control signal line $22\_j$. Herein, $1 \le j \le n$, where j is an integer and $j \ne i$.

In an example, as shown in FIG. 18, the data lines 42 at least include a first data line 421, and the first data line 421 is electrically connected to each of the first sub-pixel P1 and the second sub-pixel P2. Each of the first sub-pixel P1 and the second sub-pixel P2 includes a light-emitting element and the pixel driving circuit described above. The pixel driving circuit is electrically connected to the light-emitting element, and the pixel driving circuit provides a light-emitting current to the light-emitting element. In the first operating state, the first sub-pixel P1 is electrically connected to the $q^{th}$ scan line $62\_q$, and the second sub-pixel P2 is electrically connected to the $p^{th}$ scan line $62\_p$. In the first operating state, the driving method further includes the following steps.

The first data line 421 is controlled to provide an adjustment voltage V1 to the first sub-pixel P1 in an adjustment stage. A potential of the first electrode of the driving transistor in the second sub-pixel P2 is V2, and a difference between V1 and V2 is smaller than or equal to a preset threshold. And, in the adjustment stage, the $p^{th}$ scan line $62\_p$ is controlled to provide a non-enable level and the $q^{th}$ scan line $62\_q$ is controlled to provide an enable level. That is, the adjustment stage is in the data maintaining stage of the first sub-pixel P1 and the second sub-pixel P2. In the adjustment stage, the control module 12 in the pixel driving circuit of the first sub-pixel P1 is turned off, and the potential input to the first electrode of the driving transistor T1 in the first sub-pixel P1 will not affect the potential of the gate electrode of the driving transistor T1. If the difference between V1 and V2 is smaller than or equal to the preset threshold, the driving transistor T1 of the second sub-pixel P2 operating in the second sub-mode in the first operating state and the driving transistor T1 of the first sub-pixel P1 operating in the first sub-mode in the first operating state tend to have a consistent bias state in the data maintaining stage. With this configuration, the brightness of the second sub-pixel P2 operating in the second sub-mode in the first operating state and the brightness of the first sub-pixel P1 operating in the first sub-mode in the first operating state tend to be consistent, thereby further improving the display effect of the display panel.

Figure 26:
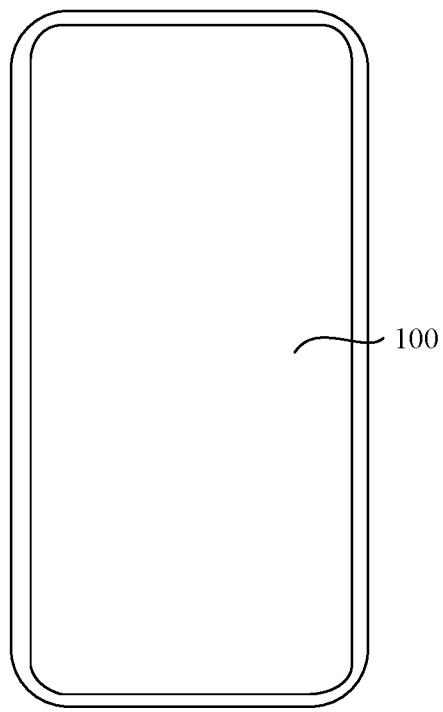
FIG. 26 is a schematic diagram of a display device according to an embodiment of the present disclosure.

An embodiment of the present disclosure further provides a display device. As shown in FIG. 26, which is a schematic diagram of a display device according to an embodiment of the present disclosure, the display device includes the display panel 100 described above. A structure of the display panel 100 has been described in detail in the foregoing embodiments and will not be repeated herein. Certainly, the display device shown in FIG. 26 is merely illustrative, and the display device may be any electronic device with a display function, such as a mobile phone, a tablet computer, a notebook computer, an electronic paper book, or a television.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A pixel driving circuit, comprising:
a driving transistor;
a gate writing module; and
a control module,
wherein the control module and the gate writing module are connected in series on a function signal transmission path between a function signal terminal and a gate electrode of the driving transistor, and the gate writing module is configured to provide a function signal at the function signal terminal to the gate electrode of the driving transistor; and
wherein an operating process of the pixel driving circuit comprises a stage in which the gate writing module is turned on and the control module is turned off; and
a control terminal of the gate writing module is electrically connected to a scan signal terminal; and
a control terminal of the control module is electrically connected to a control signal terminal,
wherein the operating process of the pixel driving circuit comprises a first data retention stage comprising a function period, wherein the scan signal terminal is configured to provide an enable level in the function period, and wherein the control signal terminal is configured to provide a non-enable level in the function period;
wherein the function signal terminal comprises a data signal terminal, the gate writing module comprises a data writing module, and the scan signal terminal comprises a first scan signal terminal and a second scan signal terminal;
wherein the data writing module comprises a data writing transistor and a threshold compensation transistor, wherein a gate electrode of the data writing transistor is electrically connected to the first scan signal terminal, a gate electrode of the threshold compensation transistor is electrically connected to the second scan signal terminal, a first electrode of the data writing transistor is electrically connected to the data signal terminal, a second electrode of the data writing transistor is electrically connected to a first electrode of the driving transistor, a first electrode of the threshold compensation transistor is electrically connected to a second electrode of the driving transistor, and a second electrode of the threshold compensation transistor is electrically connected to the gate electrode of the driving transistor;
wherein the control module comprises a first control sub-module, the first control sub-module and the data writing module connected in series on a data signal transmission path between the data signal terminal and the gate electrode of the driving transistor;
wherein the control signal terminal comprises a first control signal sub-terminal electrically connected to a control terminal of the first control sub-module; and
wherein the function period comprises a charging period, at least one of the first scan signal terminal and the second scan signal terminal are configured to provide an enable level in the charging period, and the first control signal sub-terminal is configured to provide a non-enable level at least in the charging period.

2. The pixel driving circuit according to claim 1,
wherein the first control sub-module is located between the data signal terminal and the data writing transistor; or
wherein the first control sub-module is located between the second electrode of the data writing transistor and the first electrode of the driving transistor; or
wherein the first control sub-module is located between the first electrode of the threshold compensation transistor and the second electrode of the driving transistor.

3. The pixel driving circuit according to claim 1,
wherein the function signal terminal comprises a first reset signal terminal, the gate writing module comprises a gate reset module, the gate reset module comprises a gate reset transistor, and the scan signal terminal comprises a third scan signal terminal;
wherein a gate electrode of the gate reset transistor is electrically connected to the third scan signal terminal, a first electrode of the gate reset transistor is electrically connected to the first reset signal terminal, and a second electrode of the gate reset transistor is electrically connected to the gate electrode of the driving transistor;
wherein the control module comprises a second control sub-module, and the second control sub-module and the gate reset module are connected in series on a reset signal transmission path located between the first reset signal terminal and the gate electrode of the driving transistor;
wherein the control signal terminal comprises a second control signal sub-terminal electrically connected to a control terminal of the second control sub-module; and
wherein the function period comprises a gate reset period, the third scan signal terminal is configured to provide an enable level in the gate reset period, and the second control signal sub-terminal is configured to provide a non-enable level at least in the gate reset period.

4. The pixel driving circuit according to claim 1,
wherein the gate writing module comprises at least two gate writing modules;
wherein the control terminals of the at least two gate writing modules are electrically connected to at least two different scan signal terminals; and the at least two gate writing modules are electrically connected to the gate electrode of the driving transistor through a same control module;
wherein the first data retention stage comprises at least two function periods; and
wherein the scan signal terminal is configured to provide an enable level in a corresponding function period of the at least two function periods, and the control signal terminal is configured to provide a non-enable level in the at least two function periods.

5. A display panel, comprising:
a plurality of pixel driving circuits, wherein at least one pixel of the plurality of pixel driving circuits comprises a driving transistor, a gate writing module and a control module,
wherein the control module and the gate writing module are connected in series on a function signal transmission path between a function signal terminal and a gate electrode of the driving transistor, and the gate writing module is configured to provide a function signal at the function signal terminal to the gate electrode of the driving transistor, and
wherein an operating process of the pixel driving circuit comprises a stage in which the gate writing module is turned on and the control module is turned off;

a control signal line electrically connected to a control terminal of the control module; and a control driving circuit electrically connected to the control signal line, wherein a control terminal of the gate writing module is electrically connected to a scan signal terminal; and the control terminal of the control module is electrically connected to a control signal terminal, wherein the operating process of the pixel driving circuit comprises a first data retention stage comprising a function period, wherein the scan signal terminal is configured to provide an enable level in the function period, and wherein the control signal terminal is configured to provide a non-enable level in the function period.

6. The display panel according to claim 5, wherein the display panel is divided into a first area and a second area;

wherein in a first operating state, the first area is a low-frequency scan area and the second area is a high-frequency scan area;

wherein in the first operating state, the second area is provided with a first pixel driving circuit row, and the first pixel driving circuit row comprises the pixel driving circuits arranged along a first direction; and wherein the first pixel driving circuit row comprises a first-type pixel driving circuit;

wherein the display panel comprises n control signal lines, at least one of the n control signal lines extends along a second direction intersecting with the first direction; and wherein, at least an $i^{th}$ control signal line of the n control signal lines provides a non-enable signal to the first-type pixel driving circuit during scan time corresponding to the second area; where $1 \leq i \leq n$, and both i and n are integers.

7. The display panel according to claim 6, wherein the control driving circuit comprises a first shift driving module and first logic circuits; and the first shift driving module comprises first shift units that are cascaded;

wherein at least one of the first logic circuits comprises:
a first input terminal electrically connected to an output terminal of a corresponding first shift unit of the first shift units that are cascaded,
a second input terminal electrically connected to a first regulating signal line, and
an output terminal electrically connected to a corresponding one control signal line of the control signal lines in one-to-one correspondence;

wherein the first shift units that are cascaded comprise at least an $i^{th}$ first shift unit electrically connected to the $i^{th}$ control signal line, wherein during scan time corresponding to the second area, an output signal of the $i^{th}$ first shift unit and a signal of the first regulating signal line provide a non-enable level to the $i^{th}$ control signal line after logic operation of the first logic circuit.

8. The display panel according to claim 7, wherein in the first operating state, the first pixel driving circuit row further comprises a second-type pixel driving circuit;

wherein at least a $j^{th}$ control signal line of the n control signal lines provides an enable signal to the second-type pixel driving circuit in the first pixel driving circuit row during the scan time corresponding to the second area; where $1 \leq j \leq n$, j is an integer, and $j \neq i$.

9. The display panel according to claim 8, wherein the first shift units that are cascaded further comprise a $j^{th}$ first shift unit electrically connected to the $j^{th}$ control signal line;

wherein in the first operating state, during the scan time corresponding to the second area, a signal output from the $j^{th}$ first shift unit and a signal of the first regulating signal line after logic operation of the first logic circuit provide an enable level to the $j^{th}$ control signal line;

wherein in the first operating state, the first area is at least provided with a second pixel driving circuit row, and the second pixel driving circuit row comprises the pixel driving circuits arranged along the first direction; and wherein in the first operating state, during scan time corresponding to the first area, each of the $i^{th}$ control signal line and the $j^{th}$ control signal line provides an enable signal to the second pixel driving circuit row.

10. The display panel according to claim 9, wherein the first logic circuit is configured to perform NOR operation on a signal at the first input terminal and a signal at the second input terminal; during the scan time corresponding to the first area, the first regulating signal line provides a high level; and during the scan time corresponding to the second area, the first regulating signal line provides a low level, the output terminal of the $i^{th}$ first shift unit outputs a low level, and the output terminal of the $j^{th}$ first shift unit terminal outputs a high level; or wherein the first logic circuit is configured to perform NAND operation on a signal at the first input terminal and a signal at the second input terminal; during the scan time corresponding to the first area, the first regulating signal line provides a low level; and during the scan time corresponding to the second area, the first regulating signal line provides a high level, the output terminal of the $i^{th}$ first shift unit outputs a high level, and the output terminal of the $j^{th}$ first shift unit outputs a low level.

11. The display panel according to claim 8, wherein the shift unit comprises a first processing unit, a second processing unit and an output unit;

wherein the first processing unit provides a signal of an input terminal to a first node in response to a signal at the first clock signal terminal, and the first processing unit provides a signal at a first level signal terminal to the first node in response to a signal at the second clock signal terminal and a signal at a third node;

wherein the second processing unit provides a signal at a second level signal terminal to the third node in response to the signal at the first clock signal terminal, the second processing unit provides the signal at the first clock signal terminal to the third node in response to a signal at the first node, the second processing unit provides the signal at the second clock signal terminal to a fourth node in response to the signal at the third node, and the second processing unit provides a signal at the fourth node to a second node in response to the signal at the second clock signal terminal; and wherein the output unit provides the signal at the second level signal terminal to an output terminal in response to the signal at the first node, and the output unit provides the signal at the first level signal terminal signal to the output terminal in response to a signal at the second node.

12. The display panel according to claim 11, further comprising a first clock line and a second clock line,
wherein the first clock line is electrically connected to at least one of the first clock signal terminals of first shift units of odd-numbered stage and at least one of the second clock signal terminals of first shift units of even-numbered stage; and the second clock line is electrically connected to at least one of the second clock signal terminals of the first shift units of odd-numbered stage and at least one of the first clock signal terminals of the first shift unit of even-numbered stage;
wherein the first clock line and the second clock line are configured to provide a suspension signal at least during the scan time corresponding to the second area, wherein under an action of the suspension signal, the output terminal of the $i^{th}$ first shift unit and the output terminal of the $j^{th}$ first shift unit output different levels, to provide an non-enable level to the $i^{th}$ control signal line and provide an enable level to the $j^{th}$ control signal line.

13. The display panel according to claim 12, further comprising a start signal line,
wherein the start signal line is electrically connected to an input terminal of a $1^{st}$ first shift unit;
wherein a continuous duration of an enable signal transmitted by the start signal line is T, and a shift duration of two adjacent first shift units is E; and
wherein in the first operating state, the number of the first-type pixel driving circuits is M, where T=E*M.

14. The display panel according to claim 12, wherein a continuous duration of the suspension signal is related to the scan time corresponding to the second area in the first operating state.

15. A display device, comprising the display panel according to claim 5.

16. A driving method for driving a display panel, comprising a plurality of pixel driving circuits, wherein at least one of the plurality of pixel driving circuits comprises a driving transistor, a gate writing module and a control module, wherein the control module and the gate writing module are connected in series on a function signal transmission path between a function signal terminal and a gate electrode of the driving transistor, and the gate writing module is configured to provide a function signal at the function signal terminal to the gate electrode of the driving transistor, and wherein an operating process of the pixel driving circuit comprises a stage in which the gate writing module is turned on and the control module is turned off;
a control signal line electrically connected to a control terminal of the control module; and,
a control driving circuit electrically connected to the control signal line;
wherein a control terminal of the gate writing module is electrically connected to a scan signal terminal; and
the control terminal of the control module is electrically connected to a control signal terminal,
wherein the operating process of the pixel driving circuit comprises a first data retention stage comprising a function period, wherein the scan signal terminal is configured to provide an enable level in the function period, and wherein the control signal terminal is configured to provide a non-enable level in the function period; and
the method comprising:
providing a non-enable signal to at least part of the control signal line by using the control driving circuit.

17. The driving method according to claim 16,
wherein n control signal lines are provided, and providing a non-enable signal to at least part of the control signal line by using the control driving circuit comprises:
receiving a first image to be displayed; and
controlling the display panel to enter a first operating state based on data of the first image to be displayed, wherein in the first operating state, the display panel is divided into a first area and a second area, the first area is a low-frequency scan area and the second area is a high-frequency scan area, the second area is at least provided with a first pixel driving circuit row, and the first pixel driving circuit row comprises a first-type pixel driving circuit; and,
providing, by using the control driving circuit, a non-enable signal to the first-type pixel driving circuit at least through an $i^{th}$ control signal line of the n control signal lines, where $1 \leq i \leq n$ and both i and n are integers in the first operating state, during scan time corresponding to the second area.

18. The driving method according to claim 17,
wherein in the first operating state, the first pixel driving circuit row further comprises a second-type pixel driving circuit, and the driving method further comprises:
providing, by using the control driving circuit, an enable signal to the second-type pixel driving circuit at least through the $j^{th}$ control signal line, where $1 \leq j \leq n$, j is an integer, and $j \neq i$.

* * * * *